US012413043B2

(12) United States Patent
Chen et al.

(10) Patent No.: US 12,413,043 B2
(45) Date of Patent: Sep. 9, 2025

(54) SELF-MIXING INTERFERENCE DEVICE WITH TUNABLE MICROELECTROMECHANICAL SYSTEM

(71) Applicant: Apple Inc., Cupertino, CA (US)

(72) Inventors: Tong Chen, Fremont, CA (US); Ahmet Fatih Cihan, San Jose, CA (US); Edward Vail, Menlo Park, CA (US); Weiping Li, Pleasanton, CA (US); Xiaolong Fang, Fremont, CA (US); Xibin Zhou, Palo Alto, CA (US); Pengfei Qiao, El Cerrito, CA (US)

(73) Assignee: Apple Inc., Cupertino, CA (US)

( * ) Notice: Subject to any disclaimer, the term of this patent is extended or adjusted under 35 U.S.C. 154(b) by 856 days.

(21) Appl. No.: 17/480,704

(22) Filed: Sep. 21, 2021

(65) Prior Publication Data

US 2023/0089141 A1    Mar. 23, 2023

(51) Int. Cl.
*H01S 5/00* (2006.01)
*H01S 3/105* (2006.01)
*H01S 5/026* (2006.01)
*H01S 5/0687* (2006.01)
*H01S 5/14* (2006.01)
(Continued)

(52) U.S. Cl.
CPC ............ *H01S 5/0262* (2013.01); *H01S 3/105* (2013.01); *H01S 5/0687* (2013.01); *H01S 5/14* (2013.01); *H01S 5/18311* (2013.01); *H01S 5/18361* (2013.01); *H01S 5/423* (2013.01); *H01S 5/0028* (2013.01); *H01S 5/0264* (2013.01); *H01S 5/18366* (2013.01)

(58) Field of Classification Search
CPC ...... H01S 5/0262; H01S 3/105; H01S 5/0687; H01S 5/14; H01S 5/18311; H01S 5/18361; H01S 5/423; H01S 5/0028; H01S 5/0264; H01S 5/18366
See application file for complete search history.

(56) References Cited

U.S. PATENT DOCUMENTS 5,539,562 A   7/1996  Morioka
5,974,071 A  10/1999  Jiang et al.
(Continued)

FOREIGN PATENT DOCUMENTS

CN       2738434     11/2005
CN     101592605     12/2009
(Continued)

OTHER PUBLICATIONS

U.S. Appl. No. 18/143,517, filed May 4, 2023, Lin et al.
(Continued)

*Primary Examiner* — Kinam Park
(74) *Attorney, Agent, or Firm* — Brownstein Hyatt Farber Schreck, LLP

(57) ABSTRACT

Self-mixing interferometry (SMI) sensors may include vertical cavity surface emitting lasers (VCSEL), photodetectors, and microelectromechanical systems (MEMS). The VCSEL, photodetectors, and MEMS may be vertically stacked. The MEMS may be moveable with respect to a VCSEL and may change a cavity length associated with the VCSEL. By changing the cavity length associated with the VCSEL, certain properties of emitted light may be changed, such as a wavelength value of the emitted light.

20 Claims, 14 Drawing Sheets

(51) Int. Cl.
*H01S 5/183* (2006.01)
*H01S 5/42* (2006.01)

(56) References Cited

U.S. PATENT DOCUMENTS

| | | | |
|---|---|---|---|
| 5,978,401 A | 11/1999 | Morgan | |
| 6,055,262 A | 4/2000 | Cox et al. | |
| 6,253,097 B1 | 6/2001 | Aronow et al. | |
| 6,272,269 B1 | 8/2001 | Naum | |
| 6,310,707 B1 | 10/2001 | Kawase et al. | |
| 6,348,684 B1 | 2/2002 | Nykolak et al. | |
| 6,459,835 B1 | 10/2002 | Nagaoka et al. | |
| 6,574,398 B2 | 6/2003 | Coldren et al. | |
| 6,592,245 B1 | 7/2003 | Tribelsky et al. | |
| 6,597,713 B2 | 7/2003 | Ouchi | |
| 6,636,539 B2 | 10/2003 | Martinsen | |
| 6,814,901 B2 | 11/2004 | Itoh | |
| 6,829,442 B2 | 12/2004 | Murray | |
| 6,931,042 B2 | 8/2005 | Choquette et al. | |
| 6,967,754 B2 | 11/2005 | Bratt et al. | |
| 6,987,306 B2 | 1/2006 | Fathimulla et al. | |
| 7,030,359 B2 | 4/2006 | Römhild | |
| 7,157,298 B2 | 1/2007 | Nakayama et al. | |
| 7,264,408 B2 | 9/2007 | Togami et al. | |
| 7,277,463 B2 | 10/2007 | Guenter | |
| 7,286,766 B2 | 10/2007 | Shelton | |
| 7,324,574 B2 | 1/2008 | Kim | |
| 7,349,604 B2 | 3/2008 | Clark | |
| 7,446,359 B2 | 11/2008 | Lee et al. | |
| 7,692,859 B2 | 4/2010 | Redert | |
| 7,791,591 B2 | 9/2010 | Collins et al. | |
| 7,804,875 B2 | 9/2010 | Park et al. | |
| 8,038,822 B2 | 10/2011 | Kindler | |
| 8,073,343 B2 | 12/2011 | Yuki et al. | |
| 8,113,724 B2 | 2/2012 | Terada et al. | |
| 8,153,502 B2 | 4/2012 | Li | |
| 8,319,311 B2 | 11/2012 | Chen | |
| 8,457,170 B2 * | 6/2013 | Gerlach | H01S 5/0264 372/50.1 |
| 8,467,428 B2 * | 6/2013 | Gerlach | H01S 5/18347 372/50.21 |
| 8,598,673 B2 | 12/2013 | Joshi | |
| 8,783,893 B1 | 7/2014 | Seurin et al. | |
| 8,823,859 B2 | 9/2014 | Fujimori et al. | |
| 8,890,844 B2 | 11/2014 | Hung et al. | |
| 8,917,752 B2 | 12/2014 | Chung | |
| 8,976,158 B2 | 3/2015 | Eriksson et al. | |
| 8,988,574 B2 | 3/2015 | Oshima et al. | |
| 8,989,230 B2 * | 3/2015 | Dummer | H01S 5/18361 372/20 |
| 8,995,841 B1 | 3/2015 | Chalfant, III et al. | |
| 9,091,747 B2 | 7/2015 | Pruijmboom | |
| 9,112,330 B2 | 8/2015 | Gronenborn et al. | |
| 9,164,625 B2 | 10/2015 | Holmgren et al. | |
| 9,171,723 B2 | 10/2015 | Hallam | |
| 9,215,293 B2 | 12/2015 | Miller | |
| 9,305,967 B1 | 4/2016 | Tharumalingam | |
| 9,312,954 B2 | 4/2016 | Chen et al. | |
| 9,318,873 B2 | 4/2016 | Nagatomo | |
| 9,397,476 B2 | 7/2016 | Baier | |
| 9,406,716 B2 | 8/2016 | Lin | |
| 9,525,093 B2 | 12/2016 | Costello et al. | |
| 9,544,539 B2 | 1/2017 | Roman | |
| 9,612,390 B2 | 4/2017 | Thompson et al. | |
| 9,684,074 B2 | 6/2017 | Schrank et al. | |
| 9,799,727 B2 | 10/2017 | Zhou | |
| 9,810,862 B2 | 11/2017 | Graves et al. | |
| 9,825,086 B2 | 11/2017 | Kawahara | |
| 9,860,965 B2 | 1/2018 | Recker et al. | |
| 9,917,643 B2 | 3/2018 | Shatz et al. | |
| 9,929,806 B2 | 3/2018 | Wabnig et al. | |
| 9,998,217 B2 | 6/2018 | Li et al. | |
| 10,031,158 B1 | 7/2018 | Douglas et al. | |
| 10,032,946 B2 | 7/2018 | Lanzara et al. | |
| 10,072,815 B2 | 9/2018 | MacKinnon et al. | |
| 10,148,365 B2 | 12/2018 | Sundaram | |
| 10,177,186 B2 | 1/2019 | Wang | |
| 10,181,895 B2 | 1/2019 | Liu | |
| 10,222,475 B2 | 3/2019 | Pacala et al. | |
| 10,267,505 B2 | 4/2019 | Van de Sluis et al. | |
| 10,293,691 B2 | 5/2019 | Mishra et al. | |
| 10,305,605 B2 | 5/2019 | Sun et al. | |
| 10,353,130 B2 | 7/2019 | Vandenberg et al. | |
| 10,367,021 B2 | 7/2019 | Jangjian | |
| 10,371,328 B2 | 8/2019 | Poage | |
| 10,473,764 B2 | 11/2019 | Townsend | |
| 10,476,591 B2 | 11/2019 | Laycock | |
| 10,511,383 B2 | 12/2019 | Tiecke et al. | |
| 10,571,680 B2 | 2/2020 | Igarashi | |
| 10,574,916 B2 | 2/2020 | Fukuda | |
| 10,601,507 B2 | 3/2020 | Wabnig et al. | |
| 10,663,586 B2 | 5/2020 | Pacala et al. | |
| 10,700,780 B2 | 6/2020 | Momtahan et al. | |
| 10,705,347 B2 | 7/2020 | Chen et al. | |
| 10,756,815 B2 | 8/2020 | Shih et al. | |
| 10,764,053 B2 | 9/2020 | Brook et al. | |
| 10,840,396 B2 | 11/2020 | Balimann et al. | |
| 10,871,820 B2 * | 12/2020 | Mutlu | G01B 11/14 |
| 10,903,913 B2 | 1/2021 | Sundaram | |
| 10,911,727 B2 | 2/2021 | MacKinnon | |
| 10,935,215 B1 | 3/2021 | Lin et al. | |
| 10,948,567 B2 | 3/2021 | Eberspach et al. | |
| 11,119,219 B1 | 9/2021 | LaChapelle et al. | |
| 11,157,113 B2 | 10/2021 | Winkler et al. | |
| 11,187,643 B2 | 11/2021 | Jutte et al. | |
| 11,381,060 B2 | 7/2022 | Laflaquiere et al. | |
| 11,381,307 B2 | 7/2022 | Joseph | |
| 11,448,736 B2 | 9/2022 | Hosseini et al. | |
| 11,549,799 B2 | 1/2023 | Tan et al. | |
| 11,789,156 B1 | 10/2023 | Michaels et al. | |
| 2003/0036356 A1 | 2/2003 | Witehira et al. | |
| 2003/0043435 A1 | 3/2003 | Oettinger et al. | |
| 2003/0053506 A1 | 3/2003 | Coldren | |
| 2004/0057228 A1 | 3/2004 | Huang et al. | |
| 2005/0040410 A1 | 2/2005 | Ledentsov et al. | |
| 2005/0168445 A1 | 8/2005 | Piot et al. | |
| 2005/0224701 A1 | 10/2005 | Austin | |
| 2006/0103941 A1 | 5/2006 | Yamaguchi et al. | |
| 2007/0133642 A1 | 6/2007 | Park et al. | |
| 2011/0278692 A1 | 11/2011 | Takeuchi et al. | |
| 2012/0006382 A1 | 1/2012 | Dagli et al. | |
| 2012/0019695 A1 | 1/2012 | Qian et al. | |
| 2014/0064315 A1 * | 3/2014 | Dummer | H01S 5/18361 372/50.124 |
| 2014/0213034 A1 | 7/2014 | Chang et al. | |
| 2015/0144918 A1 | 5/2015 | Cho et al. | |
| 2015/0311673 A1 | 10/2015 | Wang et al. | |
| 2015/0380902 A1 * | 12/2015 | Nagatomo | G01B 9/02001 372/45.01 |
| 2016/0178884 A1 | 6/2016 | Hanada et al. | |
| 2018/0278828 A1 | 9/2018 | Moon | |
| 2018/0341094 A1 | 11/2018 | Brukilacchio | |
| 2019/0258175 A1 | 8/2019 | Dietrich et al. | |
| 2019/0331473 A1 * | 10/2019 | Johnson | G01B 9/02015 |
| 2019/0372666 A1 | 12/2019 | Momtahan | |
| 2019/0384030 A1 | 12/2019 | Takenaka et al. | |
| 2020/0328810 A1 | 10/2020 | Momtahan et al. | |
| 2020/0370922 A1 | 11/2020 | Mort et al. | |
| 2021/0003385 A1 * | 1/2021 | Tan | H01S 5/0262 |
| 2021/0405155 A1 * | 12/2021 | Shand | G01S 7/4815 |
| 2022/0231761 A1 | 7/2022 | Momtahan et al. | |
| 2023/0152081 A1 | 5/2023 | Tan et al. | |
| 2023/0213629 A1 | 7/2023 | Zhou et al. | |
| 2024/0102852 A1 | 3/2024 | Hui et al. | |

FOREIGN PATENT DOCUMENTS

| | | |
|---|---|---|
| CN | 102427573 | 4/2012 |
| CN | 102575925 | 7/2012 |
| CN | 105716526 | 6/2016 |
| CN | 109154552 | 1/2019 |
| CN | 109428261 | 3/2019 |
| EP | 3176888 | 6/2017 |
| JP | 2000174543 | 6/2000 |

(56) References Cited

FOREIGN PATENT DOCUMENTS

| JP | 2004047636 | 2/2004 |
|---|---|---|
| KR | 1020070061191 | 6/2007 |
| KR | 1020190039927 | 4/2019 |
| WO | WO 10/111961 | 10/2010 |
| WO | WO 17/218467 | 12/2017 |
| WO | WO 18/128904 | 7/2018 |
| WO | WO 22/112679 | 6/2022 |
| WO | WO 23/003550 | 1/2023 |

OTHER PUBLICATIONS

U.S. Appl. No. 17/714,439, filed Apr. 6, 2022, Momtahan.
Huang et al., "A nanoelectromechanical tunable laser," *nature photonics*, vol. 2, Mar. 2008, pp. 180-184.
Leitgeb et al., "Using Tapers for Efficient Coupling of Received FSO-Signals into Fibres," 13th International Conference on Transparent Optical Networks in Stockholm, Sweden, Jun. 26-30, 2011, Institute of Broadband Communications, University of Technology, Graz, Austria, pp. 1-6.
Sayyah et al., "Fully Integrated FMCW LiDAR Optical Engine on a Single Silicon Chip," *Journal of Lightwave Technology*, vol. 40, No. 9, May 1, 2022, pp. 2763-2772.

\* cited by examiner

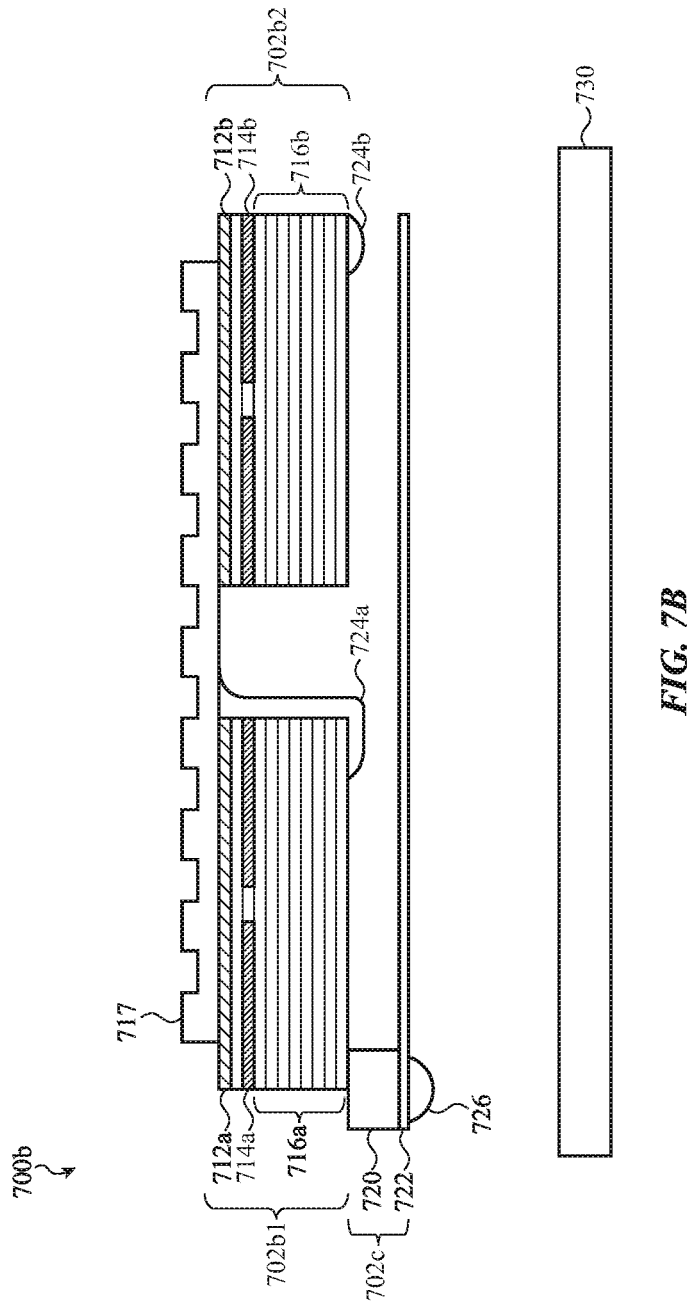

SELF-MIXING INTERFERENCE DEVICE WITH TUNABLE MICROELECTROMECHANICAL SYSTEM

FIELD

Embodiments described herein generally relate to structures and configurations of laser diodes, such as vertical cavity surface emitting lasers (VCSELs), and associated photodetectors, such as resonant cavity photodetectors (RCPDs). Laser diodes and associated photodetectors may be parts of detector systems that measure or determine displacement, distance, motion, speed, or velocity of a surface or an object using self-mixing interferometry (SMI).

BACKGROUND

Laser diodes are used for a number of purposes, such as material processing, spectroscopy, and information processing. For some applications, a wavelength of an emitted laser beam may need to be periodically changed or tuned. Tuning may be performed by changing a temperature of the laser diode. However, such methods of tuning can be time-consuming and may offer a narrow tuning range. In addition, changing a temperature of a laser diode may degrade the laser diode and/or result in a shortened lifespan of the laser diode.

SUMMARY

This summary is provided to introduce a selection of concepts in simplified form that are further described herein. This summary is not intended to identify key features or essential features of the claimed subject matter, nor is it intended to be used as an aid in determining the scope of the claimed subject matter.

In some embodiments, a self-mixing interferometry (SMI) sensor may be provided. A SMI sensor may comprise a photodetector comprising a first set of semiconductor layers formed on a substrate, a vertical cavity surface emitting laser (VCSEL) stacked with the photodetector and comprising a second set of semiconductor layers formed on the first set of semiconductor layers, and a microelectromechanical system (MEMS) stacked with the VCSEL on a side opposite from the photodetector and comprising an at least partially reflective layer. The VCSEL may be configured to emit light and the MEMS may be configured to change a length of a resonant cavity associated with the VCSEL, thereby changing a property of the emitted light.

The VCSEL may be further configured to receive reflections of the emitted light after the emitted light interacts with an object and undergo self-mixing interference after receiving the reflections of the emitted light.

A SMI sensor may further comprise a processor. At least a portion of the emitted light may be received by the photodetector and, based on at least the portion of the emitted light received by the photodetector, the processor may determine at least one of a speed of the object, a roughness of the object, or a distance between the SMI sensor and the object.

The MEMS may be separated from the VCSEL by a void in a semiconductor layer.

An SMI sensor may further comprise processing circuitry configured to supply a first current to the VCSEL, the first current configured to drive the VCSEL and supply a second current to the MEMS, the second current separate from the first current and configured to cause a movement of the MEMS. A changed property of the emitted light may be a wavelength of the emitted light.

An at least partially reflective layer of the MEMS may be formed from at least one of a third set of semiconductor layers or a set of dielectric layers.

According to some embodiments, a tunable sensor for performing self-mixing interferometry may be provided. The tunable sensor may comprise a vertical cavity surface emitting laser (VCSEL) comprising a laser cavity, a microelectromechanical system (MEMS) comprising an at least partially reflective layer defining an end of the laser cavity, and a photodetector positioned to receive light emitted by the VCSEL after the light passes through the at least partially reflective layer. A position of the at least partially reflective layer, which may be moved when a voltage is applied to the MEMS, may define a length of the laser cavity.

The VCSEL may be a first VCSEL provided on a first set of semiconductor layers, a second VCSEL may be provided on the first set of semiconductor layers, the second VCSEL having a second laser cavity and the first VCSEL and the second VCSEL being separated by a trench, and the at least partially reflective layer of the MEMS may extend across the first VCSEL and the second VCSEL and may further define a second length of the second laser cavity.

The MEMS may change the length of the laser cavity by moving the at least partially reflective layer from a first position to a second position. Changing the length of the laser cavity may result in changing a property of the light emitted by the VCSEL. The changed property of the light emitted by the VCSEL may be a wavelength of the light.

The tunable sensor may further comprise a condenser lens disposed in a light emission path of the VCSEL on a first surface opposite from a second surface where the MEMS is coupled to the VCSEL.

The VCSEL may comprise an active layer, an oxide layer adjacent to the active layer, a first set of distributed Bragg reflectors positioned between the MEMS and the oxide layer, and a second set of distributed Bragg reflectors positioned between the condenser lens and the active layer.

The photodetector may be spaced apart from the MEMS and the VCSEL.

In some embodiments, a self-mixing sensor may be provided. The self-mixing sensor may comprise a substrate, a first set of semiconductor layers positioned above the substrate, the first set of semiconductor layers operating as a first light receiving or light emitting element, a second set of semiconductor layers stacked with the first set of semiconductor layers, the second set of semiconductor layers operating as a second light receiving or light emitting element, and a microelectromechanical system (MEMS) stacked with the second set of semiconductor layers, the MEMS comprising a moveable reflective layer.

The self-mixing sensor may further comprise processing electronics electrically coupled with the first set of semiconductor layers, the processing electronics configured to analyze the electrical current produced by the first set of semiconductor layers to determine self-mixing properties of the light.

The first set of semiconductor layers and the second set of semiconductor layers may each comprise distributed Bragg reflectors.

The moveable reflective layer may comprise at least one of a diffractive grating or a subwavelength grating to polarize the light produced by the VCSEL.

The self-mixing sensor may further comprise a void positioned between the MEMS and the second set of semiconductor layers, the void and the second set of semiconductor layers at least partially defining a laser cavity.

BRIEF DESCRIPTION OF THE DRAWINGS

Reference will now be made to representative embodiments illustrated in the accompanying figures. It should be understood that the following descriptions are not intended to limit the embodiments to one or more preferred embodiments. To the contrary, they are intended to cover alternatives, modifications, and equivalents as may be included within the spirit and scope of the described embodiments as defined by the appended claims. Similar reference numerals have been used, where practicable, to designate similar features.

FIG. 7B illustrates an example self-mixing sensor array including a surface grating, as discussed herein.

Figure 1A:
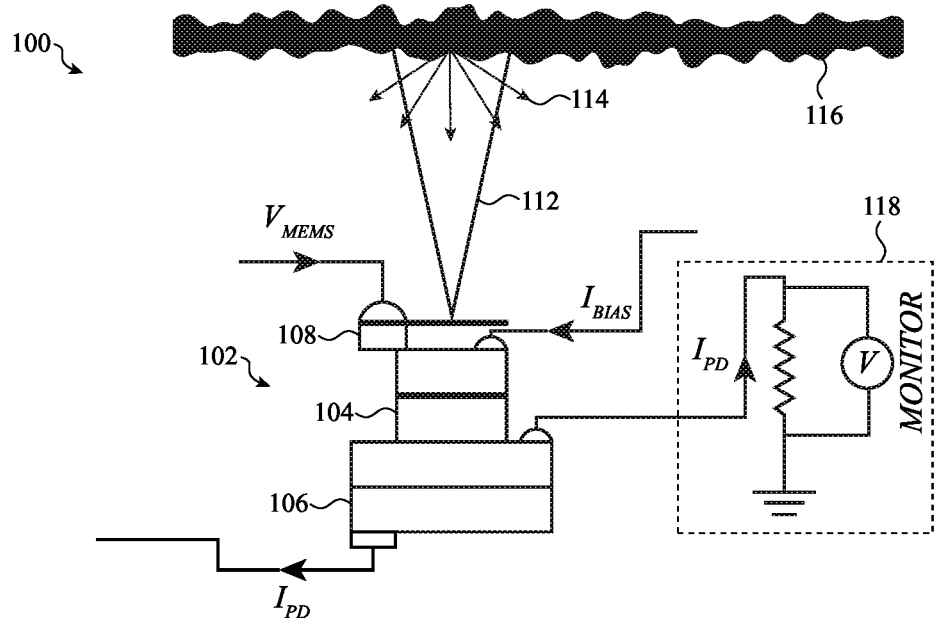
FIGS. 1A-1B illustrate an example configuration of a self-mixing sensor comprising a vertical cavity surface emitting laser (VCSEL), a vertically integrated photodetector, and a vertically integrated microelectromechanical system (MEMS) for detecting properties of an object and/or a surface, as discussed herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The embodiments described herein are directed to self-mixing interferometry (SMI) sensors. Described embodiments may include one or more SMI sensor and one or more microelectromechanical systems (MEMSs) for varying a cavity length of the SMI sensor.

A SMI sensor is defined herein as a sensor configured to generate electromagnetic radiation (e.g., light), emit the electromagnetic radiation from a resonant cavity (e.g., a resonant optical cavity), receive a returned portion of the electromagnetic radiation back into the resonant cavity, coherently or partially coherently self-mix the generated and returned electromagnetic radiation within the resonant cavity, and produce an output indicative of self-mixing (e.g., a SMI signal). The generated, emitted, and returned electromagnetic radiation may be coherent of partially coherent. In some examples, the electromagnetic radiation emitted by a SMI sensor may be generated by an electromagnetic radiation source such as a laser, which may be a vertical cavity surface emitting laser (VCSEL), a vertical external cavity surface emitting laser (VECSEL), a quantum dot laser (QDL), a quantum cascade laser (QCL), an edge emitting laser (EEL), a horizontal cavity surface emitting laser (HCSEL), a solid state laser (SSL), a gas laser, and so on. In additional or alternative examples, an electromagnetic radiation source may be a light emitting diode (LED), such as an organic LED (OLED), a resonant cavity LED (RC-LED), a micro LED (mLED), a superluminescent LED (SLED), an edge emitting LED, and so on. The generated, emitted, and returned electromagnetic radiation may include, for example, visible or invisible light, such as green light, red light, infrared (IR) light, ultraviolet (UV) light, and so on. The output of a SMI sensor (e.g., the SMI signal) may include a photocurrent produced by a photodetector, such as a photodiode, which is integrated with, or positioned under, above, or next to, the sensor's electromagnetic radiation source. Alternatively or additionally, the output of a SMI sensor may include a measurement of the current or junction voltage of the SMI sensor's electromagnetic radiation source.

According to some aspects of the present disclosure, vertical cavity surface emitting lasers (VCSELs) and associated photodetectors, such as resonance cavity photodetectors (RCPDs), are provided as a SMI sensor, though any other type of SMI sensor may be used in accordance with the provided disclosure. A VCSEL-integrated photodetector (ViP) may be provided and may reference an arrangement of a VCSEL and photodetector formed within the same epitaxial stack. Additionally or alternatively, a VCSEL and photodetector may be provided as a stacked VCSEL and photodetector. A VCSEL and photodetector may be used as a touch or an input sensor, such as may be used within an electronic device such as an electronic watch, wearable electronics, a smart phone, and so on. One or more VCSELs and/or photodetectors may perform self-mixing interference as part of a self-mixing sensor and may be used to detect a presence, proximity, displacement, distance, motion, speed, roughness, or velocity of an input surface, such as a touch screen, a button, one or more particles, or a body part. Hereinafter, for convenience, all such possibly measured parameters will be referred to simply as "displacement or motion."

Self-mixing sensors may detect the displacement or motion of an object by causing one or more VCSELs to emit a laser light toward an object by applying a forward bias to the VCSEL. Reflections of the emitted laser light from the object can be received back into the lasing cavity of the VCSEL diode. This can cause self-mixing interference in which there is a shift in the phase of a laser mode and of the emitted laser light to a new altered value.

A power shift may be concurrently detected by a photodetector which in turn can be related to the phase shift induced by, for example, object surface and volume displacement or object distance in wavelength-swept laser operations. Processing circuitry (e.g., a processor or other circuit) included in the self-mixing sensor may then be able to determine the spatial property of objects through temporal or spectral analysis of a photodetector signal. For example, a VCSEL and photodetector may be used as a self-mixing interferometry (SMI) sensor according to the above discussed principles and a microelectromechanical system (MEMS) may be affixed to a top surface of the VCSEL or the photodetector.

A SMI sensor may be used for monolithic coherent optical sensing, where the SMI sensor obtains spatial information of a target in, for example, a heterodyne detection scheme. Wide-range and fast wavelength modulation of the VCSEL may be used in order to obtain a high spatial resolution and sensing bandwidth, for a variety of detected objects and applications. Typically, VCSEL wavelength modulation can be performed by modulating an input bias current, thereby causing a change in cavity temperature and effective cavity length of the VCSEL. However, modulating the VCSEL input bias current has several potential limitations, such as a low wavelength tuning range, a slow tuning speed, temperature-induced power and wavelength non-linearity, and so on.

Aspects of the present disclosure discuss a microelectromechanical system (MEMS) structure affixed to, or otherwise in proximity to, a VCSEL structure. The MEMS may include a tunable reflective, or partially reflective, layer which may be electrostatically, electrothermally, electromagnetically, and/or piezoelectrically actuated independently of the VCSEL. In this way, the MEMS may move independently, or partially independently, from the VCSEL thereby changing a length of an internal cavity, and therefore an emitted wavelength, of the VCSEL in a controllable manner.

Movement of the MEMS may change an associated VCSEL cavity length by hundreds of nanometers, which can result in tuning ranges of approximately 0.1%-1%, 1%-5%, or greater than 5% of the wavelength emitted by the VCSEL, though these values may be any values in accordance with a free-spectral range and gain bandwidth of the VCSEL. Further, a modulation speed of the wavelength tuning may be on the megahertz order of magnitude, resulting in a tuning speed faster than cavity-thermal-based tuning speeds.

Further, a tuning range may be larger than cavity-thermal-based tuning ranges. Additionally or alternatively, the VCSEL and/or photodetector structures may maintain relatively constant power and junction temperatures over a wavelength tuning range as the MEMS moves, resulting in linear tuning. In some cases, MEMS-based tuning may be used in addition to modulating a VCSEL bias current, to provide additional flexibility in tuning a VCSEL. As used herein, the term "tuning," and any variation thereof, refers to changing a property of a VCSEL, such as changing a wavelength emitted by a VCSEL.

Various embodiments described below describe structures or configurations of the one or more VCSELs, photodetectors, and MEMS structures that may be included as parts of self-mixing sensors. A VCSEL may be stacked on a RCPD, and a MEMS structure may be stacked on top of the VCSEL, by epitaxially forming semiconductor layers and etching portions of the semiconductor layers. Alternative methods of forming the common set of semiconductor layers may be used in addition to or instead of epitaxial growth. For simplicity of explanation, the deposition or growth of the common set of semiconductor layers will be described as formed epitaxially, but one skilled in the art will recognize that alternative methods are within the scope of this disclosure. In some embodiments, a SMI structure may be flipped, so that a VCSEL is stacked, or otherwise positioned, on top of a MEMS structure and/or a photodetector structure.

These and other embodiments are described below with reference to FIGS. 1A-8. However, those skilled in the art will readily appreciate that the detailed description given herein with respect to these drawings is for explanatory purposes only and should not be construed as limiting.

FIG. 1A illustrates a self-mixing interferometry configuration 100 for a self-mixing sensor 102. As depicted in FIG. 1A, the self-mixing sensor 102 includes a VCSEL 104 (e.g., a VCSEL diode), a photodetector 106 (e.g., a resonant cavity photodetector (RCPD)) vertically stacked with the VCSEL 104, and a microelectromechanical system (MEMS) 108 vertically stacked with the VCSEL 104 and the photodetector 106. The VCSEL 104 may be configured to emit coherent or partially coherent laser light 112, which may be directed toward an object 116. The object 116 may be moveable along a three-dimensional space with respect to the self-mixing sensor 102 and may move closer to the self-mixing sensor 102, further away from the self-mixing sensor 102, and/or along a horizontal plane with respect to the self-mixing sensor 102. Although the object 116 is depicted as a relatively planar object, the is only one particular example. An object may be a user's skin, a touch surface of a device, a watch crown shaft surface, one or more particles, and so on.

As the laser light 112 contacts the object 116, reflections 114 of the laser light 112, otherwise referenced as backscatters, may reflect off of the object 116 in multiple directions. Some of the reflections 114 may be received back into a lasing cavity of the VCSEL 104, causing the VCSEL 104 to undergo self-mixing interference and thereby altering a property (e.g., a wavelength or power) of the emitted laser light 112. In additional or alternative cases, an electrical property of the VCSEL 104 is altered during self-mixing, such as a junction voltage that varies corresponding to with a distance or motion of the object 116 with respect to the self-mixing sensor 102.

The photodetector 106 may detect an operational change (e.g., a power change) in the VCSEL 104 due to the self-mixing interference. For example, the VCSEL 104 may emit some laser light downwards into the photodetector 106.

Any alterations in the emitted laser light 112 due to self-mixing interference may also occur in the downward emitted laser light, and cause an operational change in the photodetector 106. For example, a variation in a photocurrent $I_{PD}$ of the photodetector 106 may be detected by a current monitor 118. As depicted in FIG. 1A, a photocurrent $I_{PD}$ may flow out of a back side of the photodetector 106 to establish a reverse voltage bias.

The MEMS 108 may be positioned on a top surface of the VCSEL 104. In some cases, the MEMS 108 includes a reflector, such as a surface grating (e.g., a diffractive or subwavelength grating), a meta-structure, a stack of thin-film reflectors, or a Distributed Bragg Reflector (DBR), that expands an internal lasing cavity of the VCSEL 104. A voltage $V_{MEMS}$ may additionally be applied to the MEMS 108. When the voltage $V_{MEMS}$ is applied, the MEMS 108 may move or may deform with respect to a top surface of the VCSEL 104. As the MEMS 108 moves or deforms, an internal lasing cavity of the VCSEL 104 changes, thereby changing a wavelength of emitted laser light. The movement or deformation of the MEMS 108 may be controllable through control of a value of the $V_{MEMS}$ and/or a duration when the $V_{MEMS}$ is applied. As described herein, the MEMS may be electrostatically actuated. In some implementations, the MEMS may be actuated electrothermally, electromagnetically, or piezoelectrically.

The VCSEL 104 may emit the laser light 112 under a forward voltage bias above a laser threshold. During such a forward voltage bias, a bias current $I_{BIAS}$ 110 flows through the VCSEL 104 and may induce laser light emission from the VCSEL 104. The photodetector 106 may be reverse biased during at least part of the time that the VCSEL 104 is forward biased.

Figure 1B:
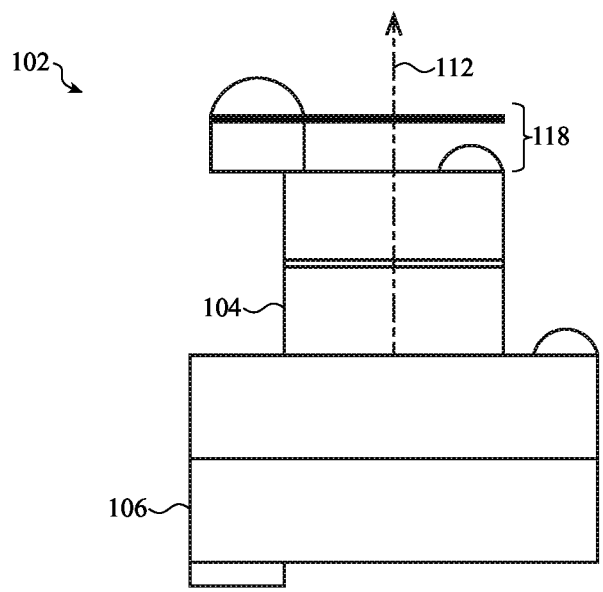

FIG. 1B illustrates an exemplary configuration of a self-mixing sensor 102, such as described above with respect to FIG. 1A. The self-mixing sensor 102, as depicted, includes a VCSEL 104, a photodetector 106, and a MEMS 108. The VCSEL 104, as discussed above, may be part of the self-mixing sensor 102 and, in some cases, other types of electromagnetic radiation sources may be used. In any type of laser, an input energy source causes a gain material within a cavity to emit light. Reflectors on opposite ends of the cavity feed the light back into the gain material to cause amplification of the light and to cause the light to become coherent, with a uniform wavelength, or partially coherent, with a partially uniform wavelength. At least one reflector may be partially reflective and may permit light to escape a cavity under certain conditions (e.g., a strength/coherence of light within a laser cavity).

In the VCSEL 104, two reflectors may be provided on opposite ends of the laser cavity, where one reflector may be defined by the MEMS 108. The lasing process occurs within the defined laser cavity. In the case of VCSELs, the two reflectors may be implemented as distributed Bragg reflectors, which are alternating reflective layers with high and low refractive indices. The laser cavity contains a gain material, which may include multiple doped layers of III-V semiconductors. Specific details of the semiconductor materials will be presented below for the various embodiments. The emitted laser light can be emitted through the topmost layer or surface of the VCSEL 104. In the VCSEL 104, the coherent light is also emitted through the bottom layer and is received by the photodetector 106 so that self-mixing operations may be analyzed and a motion or distance of an object upon which the VCSEL 104 emits light can be determined.

As discussed with respect to FIG. 1A, a MEMS 108 may be provided at a top portion of the VCSEL 104. The MEMS 108 may be moveable and may act as a partially transmissive reflector defining one end of a laser cavity. Accordingly, the MEMS 108 may be formed from one or more distributed Bragg reflectors (DBR). As the MEMS 108 moves relative to a top surface of the VCSEL 104, a length of the laser cavity of the VCSEL 104 changes, resulting in a wavelength of emitted light 112 changing. The MEMS 108 may be coupled to the VCSEL 104 through a sacrificial DBR layer (e.g., a DBR layer only provided for structural purposes and not for a potential separate utility as a reflective layer) and may be provided in a cantilevered state, though any MEMS 108 structure capable of expanding or contracting a VCSEL 104 laser cavity may be used in accordance with the provided disclosure. In some cases, the MEMS 108 is supported on one or more sides with respect to the VCSEL 104.

Figure 2A:
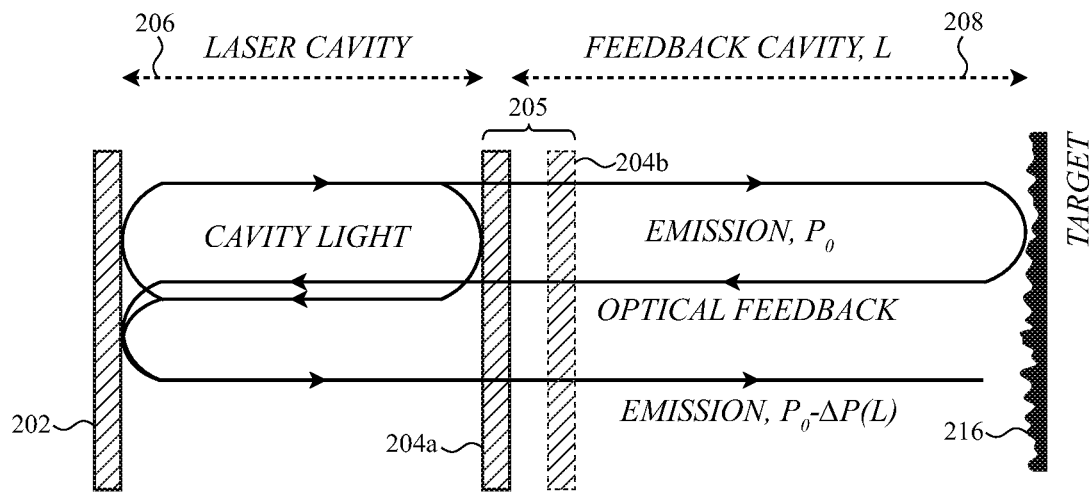
FIG. 2A depicts an example self-mixing interference process occurring with respect to a self-mixing sensor, as discussed herein.
Figure 2B:
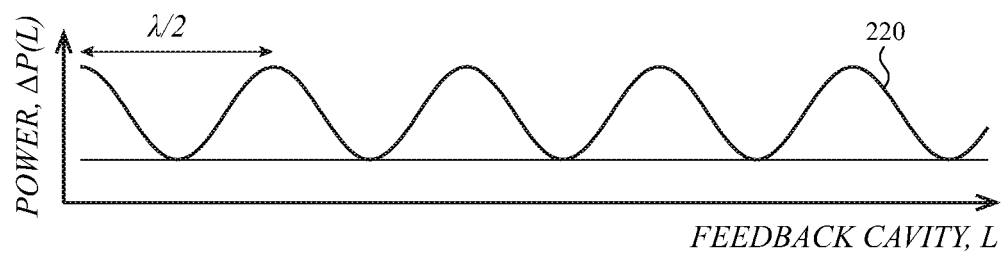
FIG. 2B depicts a graph showing a variation in a power level of laser light emitted from a VCSEL undergoing self-mixing interference with respect to length of a feedback cavity, as discussed herein.
Figure 2C:
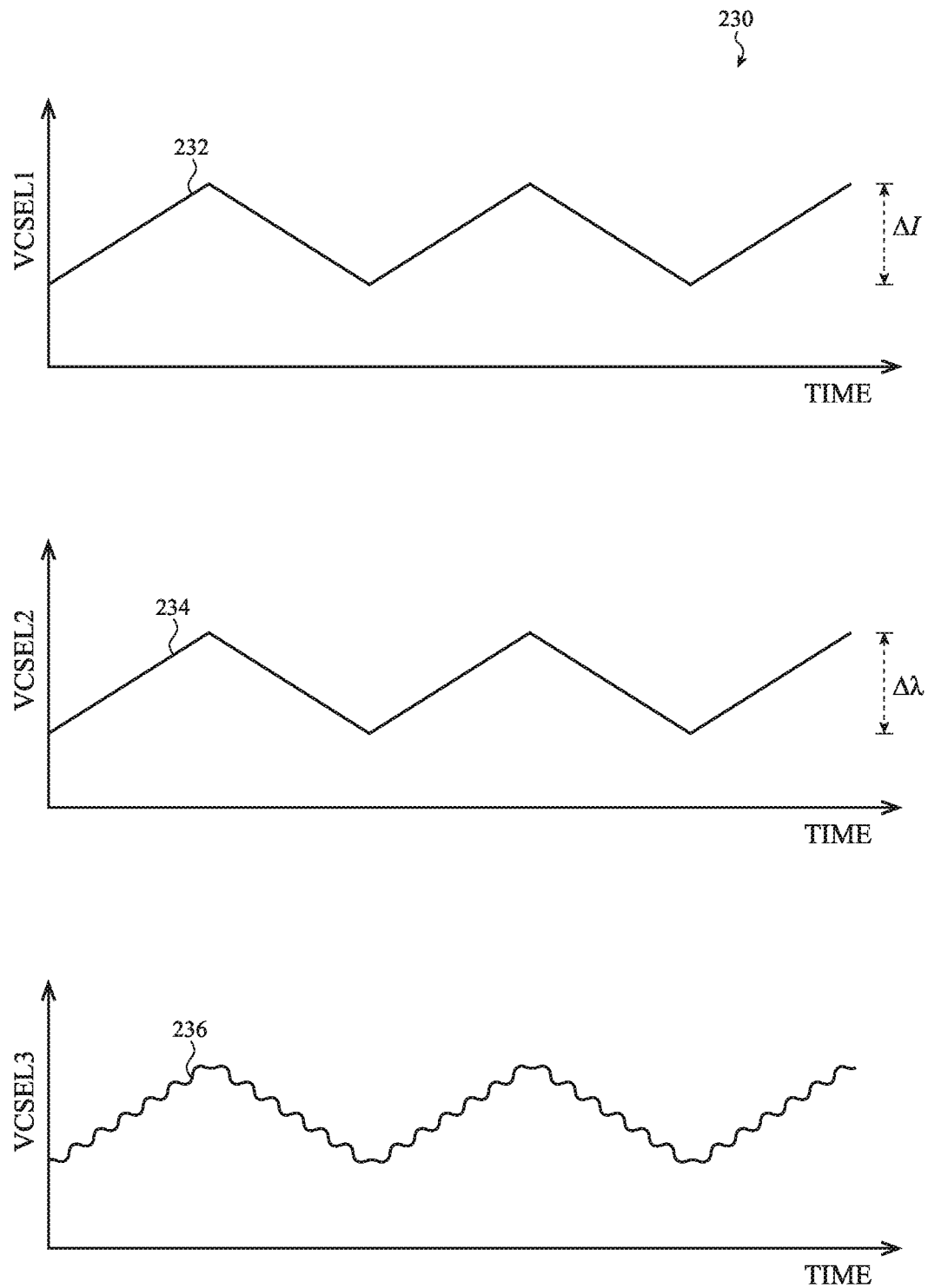
FIG. 2C depicts time correlated graphs of a laser current, laser wavelength, and a signal of an interferometric parameter that can be used as part of a spectrum analysis, as discussed herein.

FIGS. 2A-2C illustrate properties of self-mixing interference of emitted laser light in a VCSEL. The explanations are intended only to describe certain aspects of self-mixing interference needed to understand the disclosed embodiments. Other aspects of self-mixing interference will be clear to one skilled in the art.

FIG. 2A depicts a functional diagram of a laser device, such as a VCSEL described with respect to FIGS. 1A-1B, that may be used as part of a self-mixing sensor. As discussed above, in any type of laser, an input energy source causes a gain material within a cavity to generate light. Reflectors 202 and 204a on opposite ends of a laser cavity 206 feed the light back into the gain material to cause amplification of the light within the laser cavity 206 and to cause the light to become coherent, with a uniform wavelength, or partially coherent, with a partially uniform wavelength. In some implementations, one of reflectors 202/204a may be partially reflective and may permit light to pass through under certain conditions (e.g., a coherence/intensity of light within the laser cavity 206). As discussed below, the reflector 204a may be moveable by a distance 205, as indicated by reflector 204b, depicted in phantom. That is, during a tuning process, the reflector may change positions, thereby changing a length of the laser cavity 206.

In FIG. 2A, the laser cavity 206 is shown reoriented so that the emitted laser light is emitted from the laser cavity 206 to the right. The laser cavity 206 has a length established at manufacture and the length may be tuned, or changed, due to movement of an associated MEMS (e.g., a reflector that moves between 204a and 204b as depicted in FIG. 2A). The emitted laser light travels away from the laser cavity 206 until it intersects or impinges on a target 216, such as an input surface or another object. The gap of distance L from the emission point through the reflector 204a of the emitted laser light to the target 216 is termed the feedback cavity 208. The length L of the feedback cavity 208 is variable as the target 216 can move with respect to the laser device.

After the emitted light comes into contact with the target 216, part or all of the emitted light may be reflected back into the laser cavity 206 as optical feedback. The reflected light enters the laser cavity 206 to coherently or partially coherently interact with the generated laser light. This results in a new state illustrated with a novel emission, $P_0-\Delta P(L)$. The new emitted laser light at the new state may have characteristics (e.g., a wavelength or power) that differ from what the emitted laser light would have in the absence of reflection and self-mixing interference. Properties of the novel emission may change depending on a length of the feedback cavity 208.

The reflector 204a may be part of a MEMS structure and may be moveable with respect to reflector 202, thereby changing a length of the laser cavity 206 and a wavelength of emitted light. The reflector 204a may be moveable by a predetermined distance 205. The predetermined distance 205 may correspond to a value of about 100 nanometers (nm) to 1000 nanometers (nm), though the predetermined distance 205 may be any distance according to principles of the provided disclosure.

FIG. 2B is a graph 220 showing the variation in power of the novel emission as a function of the length L of the feedback cavity 208. The graph depicts a predominantly sinusoidal variation with a period of λ/2. Theoretical considerations imply that the variation is given by the proportionality relationship: $\Delta P \propto \cos(4\pi L/\lambda)$. This relationship generally holds in the absence of a strong specular reflection. In the case of such strong specular reflection, the cosine becomes distorted and higher harmonics are present in the relationship. However, the peak-to-peak separation stays at λ/2. For an initially stationary target 216, this relationship can be used to determine that a deflection has occurred. In conjunction with other techniques, such as counting of the completed number of periods, the range of the deflection may also be determined.

Though the graph 220 shows the variation in power of the new emitted laser light 214 as a function of the length L of the feedback cavity 208, similar results and/or graphs may hold for other interferometric properties of a VCSEL or other types of lasers and/or laser diodes that are measured by a self-mixing sensor. Measurements of one or more such interferometric parameters by a self-mixing sensor can be used to infer displacements or motions of the target 216 with respect to a laser.

FIG. 2C depicts time correlated graphs 230 relating to a laser current 232 (also called a modulation current) with the resulting laser wavelength 234 and the resulting signal 236 of the measured interferometric parameter. The graphs are under the condition of a user input. By driving a laser with a modulation current, such as the laser current 232, the produced laser light has a laser wavelength 234 that similarly varies according to a triangle wave. As a result of the user input on the touch input surface, the self-mixing interference causes the signal 236 of the interferometric parameter to have the form of a sinusoid (or distorted sinusoid) imposed on a triangle wave. One use of applying the modulation current 232 with a triangle wave is to allow for separate spectrum analyses (e.g., fast Fourier Transforms) of samples taken during the time intervals of the ascending segment and of the descending segment of the triangle waveform modulation of the laser current 232. While the graphs 230 are shown for a triangle waveform modulation of laser current 232, some embodiments may use other alternatingly ascending and descending modulation currents for the laser. Also, while the laser current 232 is shown with equal ascending and descending time intervals, in some embodiments these time intervals may have different durations.

Figure 3:
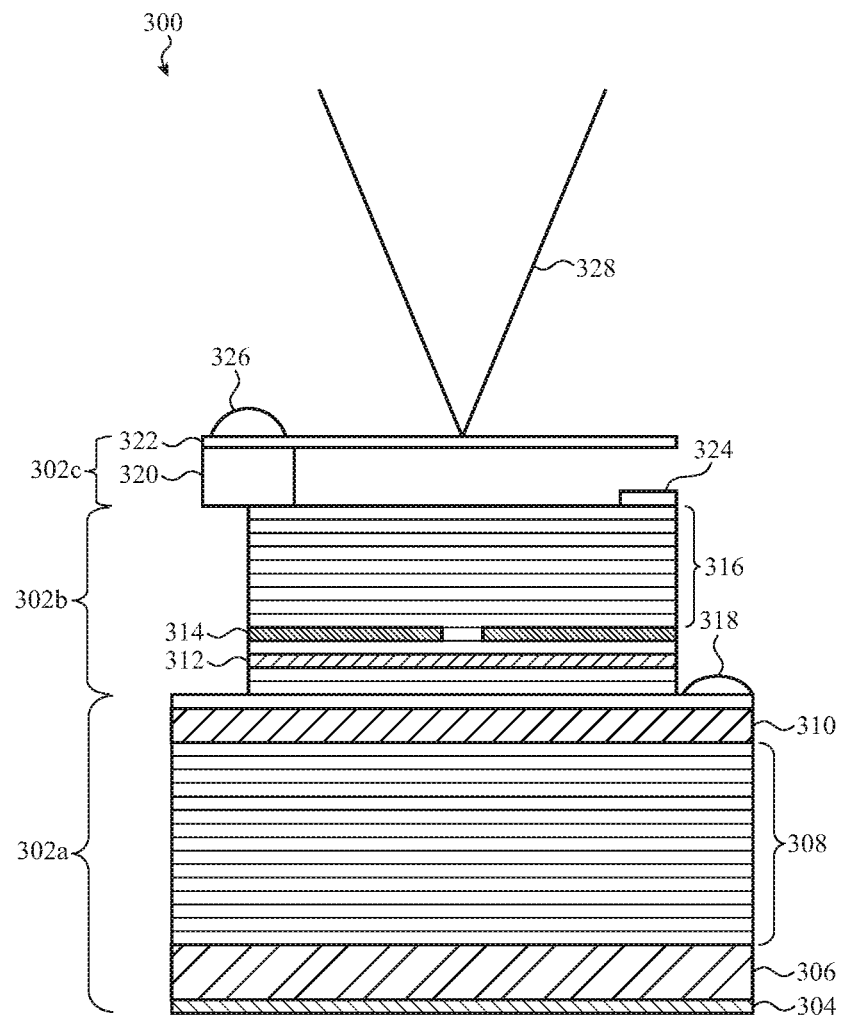
FIG. 3 illustrates an example configuration of a self-mixing sensor comprising a VCSEL-integrated photodetector (ViP) and an associated MEMS, as discussed herein.

FIG. 3 illustrates an example configuration of a self-mixing sensor 300 that may include a top epitaxial stack 302b comprising a VCSEL active area and a bottom epitaxial stack 302a comprising a photodetector and vertically adjacent to the top epitaxial stack 302b, which may be referenced as a VCSEL-integrated photodetector (ViP). In some embodiments, the bottom epitaxial stack 302a comprises a resonant cavity photodetector (RCPD). In addition, a microelectromechanical system (MEMS) 302c may be vertically adjacent to the top epitaxial stack 302b. The self-mixing sensor 300 may be manufactured and epitaxially grown by the process described with respect to FIG. 10 or may be manufactured in accordance with any suitable process. The vertical stack combination of the top epitaxial stack 302b, the bottom epitaxial stack 302a, and the MEMS 302c may provide resonance for VCSEL and RCPD operations.

The semiconductor layers for the bottom epitaxial stack 302a may be epitaxially formed on a substrate 306, such as an n-type substrate. An electrical supply layer 304 may additionally be formed in or on the substrate 306, such as on a side of the substrate 306 opposite to the bottom epitaxial stack 302a, and may be supplied with a reverse biased voltage. In some embodiments, the electrical supply layer 304 is grounded.

The bottom epitaxial stack 302a may additionally be structured with n-type distributed Bragg reflectors (nDBR) 308. The nDBR 308 may include a set of Bragg pairs of alternating materials having different refractive indices. One or more of the materials in the nDBR 308 are doped to be n-type and so form a part of the anode section of a p-n diode structure. An exemplary pair of materials that may be used to form the nDBR 308 are aluminum arsenide (AlAs) and gallium arsenide (GaAs). Though the nDBR 308 is described as an n-type DBR, the nDBR 308 may be doped to be any type. In some cases, the nDBR 308 layers may be formed from reflectors other than distributed Bragg reflectors or from a combination of other reflectors and DBR layers. Though the bottom epitaxial stack 302a is depicted as comprising multiple semiconductor layers, in some cases, a bottom epitaxial stack or photodetector may comprise a single layer.

A photodetector active region layer 310 may be formed on top of the nDBR 308. The photodetector active region layer 310 may be a photon absorption layer, such as an indium gallium arsenide (InGaAs) layer. The photodetector active region layer 310 may, in some embodiments, have a thickness between 15 nm and 1000 nm, though the thickness is not limited to any particular value or range. In some cases, the photodetector active region layer 310 is formed from one or more quantum wells, such as in a single quantum well or multiple quantum well (MQW) structure.

The top epitaxial stack 302b may be epitaxially grown on top of the bottom epitaxial stack 302a, as depicted in FIG. 3 and as discussed herein. The top epitaxial stack 302b may include a VCSEL active region layer 312 that functions, in part, as a lasing layer. The VCSEL active region layer 312 may, in some embodiments, have a thickness between 15 nm and 1000 nm, though the thickness is not limited to any particular value or range. In some cases, the VCSEL active region layer 312 may be formed from one or more quantum wells. An oxide layer 314 may be adjacent to the VCSEL active region layer 312 and may have an aperture through which laser light is guided and through which a current applied to the VCSEL is constricted.

The top epitaxial stack 302b may additionally be structured with p-type distributed Bragg reflectors (pDBR) 316. As discussed in relation to the nDBR 308, the pDBR 316 may include a set of Bragg pairs of alternating materials having different refractive indexes. Such materials may include AlAs and GaAs. The pDBR 316 may be formed from one or more materials that are doped to be p-type and so form a part of the cathode section of a p-n diode structure. The pDBR 316 layers may be optional and may be omitted in certain embodiments. An electrical contact 324 may be affixed to a topmost layer of the top epitaxial stack 302b and may receive a bias current, such as $I_{BIAS}$, as depicted in FIG.

1A, which may induce the emission of laser light 328 from the top epitaxial stack 302b. In some cases, the top epitaxial stack 302b may operate with a single mode on either an oxide aperture or high-contrast grating. A top surface of the top epitaxial stack 302b may additionally be passivated through processes such as atomic layer passivation to prevent or reduce further chemical processes and/or environmental aggressors which may degrade the top epitaxial stack 302b.

A MEMS structure 302c may be formed on a top surface of the top epitaxial stack 302b. The MEMS structure 302c may be formed from a sacrificial layer 320 and a partially reflective layer 322. The sacrificial layer 320 may be used to elevate the partially reflective layer 322 above the VCSEL 302b and may be formed of the same material as the pDBR 316 layers or undoped epitaxial layers such as intrinsic Gallium Arsenide (GaAs), though the sacrificial layer 320 may not be used as part of a lasing cavity. The partially reflective layer 322 may be formed as a vertical semiconductor stack including one or more distributed Bragg reflectors. In some cases, the partially reflective layer 322 is a dielectric stack providing partial cavity reflectance and output coupling. Materials for a potential dielectric stack include titanium dioxide ($TiO_2$) and silicon dioxide ($SiO_2$).

The partially reflective layer 322 of the MEMS structure 302c may include sub-wavelength lateral structures, such as surface relief grating, high-contrast grating, two-dimensional/binary or multi-step diffractive phase masks, meta-surfaces, and so on. The sub-wavelength lateral structures may provide strong cavity reflectivity, such as reflectivity at or about 99%. In cases where sub-wavelength lateral structures are provided on the partially reflective layer 322, DBR layers of the top epitaxial stack 302b and/or the bottom epitaxial stack 302a may be reduced or eliminated. This may reduce an overall length of the cavity and/or self-mixing sensor 300 and may improve a quality of a laser light output (e.g., increasing a stability or changing a mode of the laser light output). Sub-wavelength lateral structures may also assist in defining laser polarization, shaping and steering laser light outputs, and so on. The partially reflective layer 322 may additionally be passivated through processes such as atomic layer passivation to prevent or reduce further chemical processes and/or environmental aggressors which may degrade the partially reflective layer 322.

The MEMS structure 302c may be formed from the same materials as the top epitaxial stack 302b (e.g., GaAs) or may be formed of additional materials such as silicon, silicon nitride, and silicon dioxide. In cases where the MEMS structure 302c is formed from materials intrinsic to the top epitaxial stack 302b, the MEMS structure 302c may be formed from etching layers of an epitaxially grown semiconductor stack-up. In cases where the MEMS structure 302c is formed from extrinsic materials, the MEMS structure 302c may be formed independently of the ViP and may be deposited on a top surface of the top epitaxial stack 302b after the top epitaxial stack 302b and/or bottom epitaxial stack 302a is formed. The MEMS structure 302c, and the partially reflective layer 322 in particular, may be moveable with respect to the top epitaxial stack 302b. The movement may occur as a result of a current and/or voltage being applied to the MEMS structure 302c. In some cases, the MEMS structure 302c may be fully or partially formed of a shape memory alloy, a piezoelectric material, and so on.

As depicted in FIG. 3, the semiconductor layers for the bottom epitaxial stack 302a extend laterally beyond the semiconductor layers forming the top epitaxial stack 302b. Such a configuration may be formed by epitaxially forming all the layers included in the self-mixing sensor initially, and then etching part of the layers of the top epitaxial stack 302b. An electrical supply contact 318 may be affixed to topmost layer of the bottom epitaxial stack 302a at such a position that extends laterally beyond the VCSEL 302b. The electrical supply contact 318 may be connected to a common ground and may act as a cathode of the top epitaxial stack 302b and/or an anode of the bottom epitaxial stack 302a. In additional or alternative embodiments, the semiconductor layers for the bottom epitaxial stack 302a do not extend beyond the semiconductor layers of the top epitaxial stack 302b on one or multiple sides of the self-mixing sensor 300. In some embodiments, during formation of a particular layer of the common set of semiconductor layers, techniques such as masking and doping are used to alter a doping or chemical composition of a certain layer.

In operation, the top epitaxial stack 302b is electrically pumped. A forward voltage bias may be applied to the electrical supply contact 324, which induces a bias current $I_{BIAS}$ to flow into the top epitaxial stack 302b and induce emission of laser light 328, as described previously. For at least part of the time that the top epitaxial stack 302b is emitting laser light 328, the bottom epitaxial stack 302a may be reverse biased by the application of a higher voltage at the electrical supply layer 304 than at the electrical supply contact 318, to cause the flow of a photocurrent $I_{PD}$. In addition to the emitted laser light 328, some of the laser light produced in the VCSEL active region layer 312 may be directed downward and be absorbed or received in the reverse biased bottom epitaxial stack 302a and, specifically, by the photodetector active region layer 310.

If some of the emitted laser light 328 is reflected from an object (not shown) and is received in the top epitaxial stack 302b, self-mixing interference may occur that induces an alteration in the wavelength and/or power of the emitted laser light 328. Some of such altered laser light may then be received in the bottom epitaxial stack 302a, producing a measurable change in the photocurrent $I_{PD}$, or another electrical or interferometric property of the bottom epitaxial stack 302a. Such a measurable change may be used to infer a distance or a motion of the reflecting object. As the phrase is used herein, self-mixing interference refers to the coherent interference between light reflected from an object external to a laser cavity and light present within the laser cavity. A photodetector may detect the output (e.g., self-mixed light) produced in response to a self-mixing operation.

The MEMS structure 302c may additionally be electrostatically actuated by applying a voltage bias to an electrical supply contact 326. The voltage bias applied to the electrical supply contact 326 may be independent from the forward voltage bias applied to the electrical supply contact 324 associated with the top epitaxial stack 302b. The voltage bias applied to the electrical supply contact 326 of the MEMS structure 302c may be varied to change a property of the partially reflective layer 322. By increasing or decreasing the applied reverse voltage bias, a distance between the partially reflective layer 322 and a top surface of the top epitaxial stack 302b may increase or decrease, a curvature of the partially reflective layer 322 may change, and so on. In this way, a lasing cavity is changed. In accordance with optical principles, changing a lasing cavity may change properties (e.g., wavelengths or modes) of an emitted laser light. By variations of the partially reflective layer 322, control of lasing properties of top epitaxial stack 302b can be achieved.

In various implementations of the provided disclosure, a first current may be supplied to the top epitaxial stack 302b, a second current, distinct from the first current, may be supplied to the MEMS structure 302c, and a third current, distinct from the first and second currents, may be supplied to the bottom epitaxial stack 302a. In some implementations, distinct voltages may be supplied to the bottom epitaxial stack 302a, the top epitaxial stack 302b, and the MEMS structure 302c.

The MEMS structure 302c may allow tuning at a wavelength-scale accuracy. That is, the partially reflective layer 322 may be controlled to produce a laser light with a particular wavelength. Further, power supplied to the top epitaxial stack 302b and a temperature of the self-mixing sensor 300 may remain relatively consistent while tuning through the use of the MEMS structure 302c. In this way, tuning may be performed linearly. A tuning range of the self-mixing sensor 300 may be about 1%-5% of an initial laser wavelength produced by the VCSEL 302b, though, in some embodiments, a tuning range may be less than 1% and/or over 5%, as discussed above. Further, the MEMS structure 302c may be tuned at a megahertz modulation speed, though, in some embodiments, a modulation speed may be faster or slower. As a result of the modulation speed, a low duty cycle may be associated with the self-mixing sensor 300.

In some cases, the bottom epitaxial stack 302a may be electrically pumped in a way so as to act as a second VCSEL. That is, the structure depicted in FIG. 3 may, in some embodiments, comprise two VCSEL structures stacked on one another. This may result in a double-pumped VCSEL.

Figure 4:
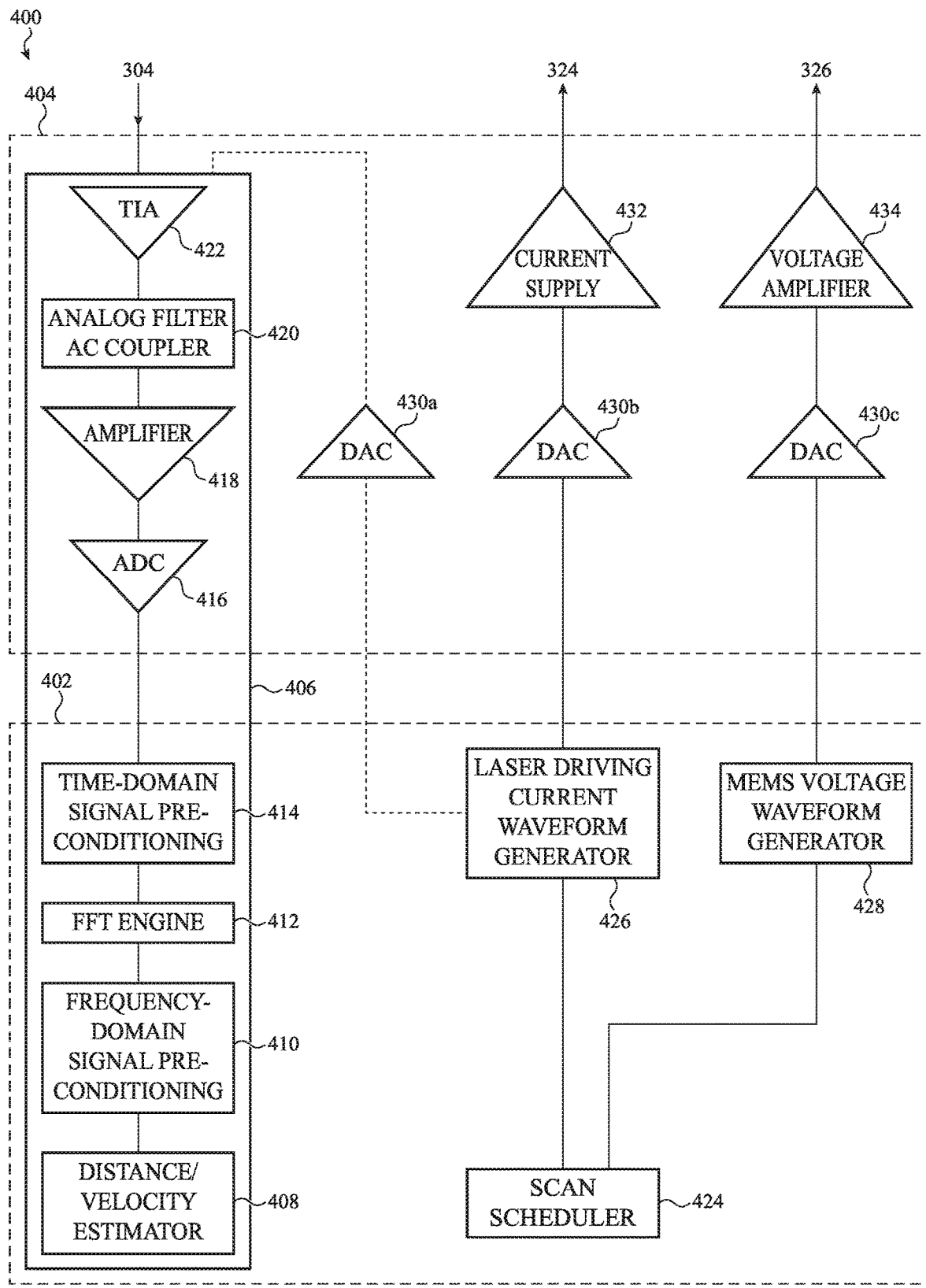
FIG. 4 illustrates example processing circuitry communicatively coupled with electrical contacts of the self-mixing sensor of FIG. 3, as discussed herein.

FIG. 4 illustrates example processing circuitry 400 communicatively coupled with one or more electrical supply contacts of a self-mixing sensor, such as the self-mixing sensor 300 as depicted in FIG. 3. The processing circuitry 400 may include any number of electrical components and may be provided on a printed circuit board or an integrated circuit (IC) coupled with a self-mixing sensor. The processing circuitry 400 may include analog circuits 404 and digital circuits 402.

Though forward and reverse biases are described as being applied to certain electrical supply contacts/layers, such description is provided merely for explanatory purposes. As understood by a person skilled in the art, any number of voltage and/or current values may be applied to any provided electrical supply contact/layer so as to create a voltage differential used to operate a VCSEL, photodetector, and/or MEMS. Any voltage, current, or combination thereof suitable to operate any of the components described herein may be used in accordance with the provided disclosure.

Though not depicted in FIG. 4, the electrical supply contact 318 may be connected to a common ground, or a positively or negatively charged object, and may be electrically coupled to both the VCSEL and the photodetector. As the electrical supply contact 318 is electrically coupled to both the VCSEL and the photodetector, the electrical supply contact 318 may act as a cathode for the VCSEL and as an anode for the photodetector.

The electrical supply layer 304, as described with respect to FIG. 3, may be electrically coupled to a photodetector. The circuit electrically coupled to the electrical supply layer 304 may be referenced as a self-mixing analysis circuit 406. The self-mixing analysis circuit 406 may include a transimpedance amplifier 422, an analog filter AC coupler 420, one or more amplifiers 418, an analog-to-digital converter 416, time-domain signal pre-conditioning circuit 414, a fast Fourier transform engine 412, a frequency-domain signal pre-conditioning circuit 410, and a distance/velocity estimator 408. Additional, or fewer, elements may be provided in additional or alternative cases.

In accordance with the provided disclosure, a photodetector may output a self-mixing current signal in response to self-mixing operations of a self-mixing sensor (e.g., a VCSEL-integrated photodetector). The self-mixing current signal may be a triangle signal and may require signal processing before being analyzed.

A transimpedance amplifier (TIA) 422 may receive a current produced by the photodetector and may convert the received current to a voltage output (e.g., acting as a type of current-to-voltage converter). The TIA 422 may be implemented with one or more operational amplifiers. Additionally, the TIA 422 may amplify current signals generated by the photodetector and may minimize instability arising from the junction capacitance of the photodetector. The TIA 422 may have a bandwidth of about 150 kilohertz (kHz) and may have TIA operating noise substantially lower than upstream shot noise.

An analog filter AC coupler 420 may be coupled to an output of the TIA 422 and may suppress DC light intensities from the photodetector. The analog filter AC coupler 420 may also prevent amplifier saturation (e.g., amplifier(s) 418). The analog filter AC coupler 420 may be a high-pass filter and may have a cut-off frequency of between 10 hertz (Hz) to 100 Hz, or about, in some cases, 40 Hz. In some embodiments, the analog filter AC coupler 420 is omitted. In additional or alternative cases, the analog filter AC coupler 420 may be positioned before the TIA 422.

One or more amplifiers 418 may additionally be provided as coupled to the TIA 422 and/or the analog filter AC coupler 420. The one or more amplifiers 418 may be used to boost an amplitude of a signal before processing the signals received by the photodetector, resulting in a positive gain. As a result of the amplified signal, changes in photodetector signals may become more apparent. An analog-to-digital converter (ADC) 416 may be coupled to the one or more amplifiers 418 to convert an analog signal to a digital signal in order to prepare photodetector signals for analysis through sampling and quantizing an input signal. The ADC 416 may have a sampling rate of between 1-5 mega-samples per second (MSPS), may be a 12-bit successive approximation ADC, and may use both shot noise and quantization noise to determine an associated cascaded noise figure of the ADC 416.

After converting an analog signal to a digital signal, as indicated by the transition between the analog circuits 404 and the digital circuits 402, processing functions may be performed to determine displacement or motion of an object sensed by the self-mixing sensor, as discussed herein.

The self-mixing analysis circuit 406 may include both time-domain signal preconditioning circuits 414 and frequency-domain signal pre-conditioning circuits 410, though in some cases one or both of these circuits may be omitted or may be located along a different portion of the self-mixing analysis circuit 406. The time-domain signal preconditioning circuits 414 may interrogate and/or analyze a self-mixing signal in the time domain and the frequency-domain signal pre-conditioning circuits 410 may interrogate and/or analyze a self-mixing signal in the frequency domain.

A fast Fourier transform (FFT) engine 412 may include a FFT and tone extraction circuit and may apply a received self-mixing signal. From the FFT spectra obtained, a property of the target (e.g., an absolute distance and directional velocity) may be inferred as indicated by distance/velocity estimator 408. The frequency domain analysis, as indicated by the frequency-domain signal pre-conditioning circuits 410, may isolate signals corresponding to a change in an operational parameter of a VCSEL and may be used to measure real-world events (e.g., a gesture, a distance between a target and a VCSEL, a speed of the target or the VCSEL, and so on). Values associated with the real-world events may be determined as indicated by the distance/velocity estimator 408.

The scan scheduler 424 may be any tool, algorithm, and/or circuit used to instruct waveform generators (e.g., laser driving current waveform generator 426 or MEMS voltage waveform generator 428) which waveform, frequency, and so on to apply to, for example, a VCSEL or a MEMS. In some cases, the scan scheduler 424 instructs one of the laser driving current waveform generator 426 or the MEMS voltage waveform generator 428 to begin or stop applying a waveform to a MEMS or a VCSEL.

The laser driving current waveform generator 426 may generate a current to operate a VCSEL, which may be applied to the electrical contact 324 as depicted in FIG. 3. The waveform generated by the laser driving current waveform generator 426 may be a symmetric, triangular waveform and may have a frequency of about 2 kilohertz, though any value may be used in accordance with the provided disclosure. A digital-to-analog converter (DAC) 430b, which may have an 8-bit conversion rate of 1 MSPS, may convert the waveform to an analog signal and a current supply 432 may convert a voltage having the waveform generated at the laser driving current waveform generator 426 to a current, thereby driving an associated VCSEL (e.g., via the electrical contact 324). In some cases, a filter (e.g., a low-pass filter) may additionally be provided to prevent frequency signals higher than a cutoff frequency (e.g., 10 hertz) from being applied to the current supply 432.

A second output of the laser driving current waveform generator 426 may lead to an additional DAC 430a and to the self-mixing analysis circuit 406. This circuit may act as a waveform correction and may be omitted in some embodiments.

The MEMS voltage waveform generator 428 may generate a driving voltage of a MEMS through, for example, electrical contact 326 as depicted in FIG. 3. The driving voltage may include a DC and/or AC bias voltage and may cause movement of the associated MEMS (e.g., to increase or decrease a lasing cavity, as discussed above with respect to FIG. 3). The driving voltage may be a periodic sinusoidal wave, when being applied to the MEMS, and may be terminated when a tuning process is not occurring. The driving voltage may be applied to the electrical contact 326 through a DAC 430c and a voltage amplifier 434.

Though certain circuits and electrical elements are discussed with respect to FIG. 4, these circuits and elements are provided merely for explanatory purposes. Any number of circuits may be utilized to drive a VCSEL, MEMS, and/or photodetector and to analyze self-mixing signals.

Figure 5A:
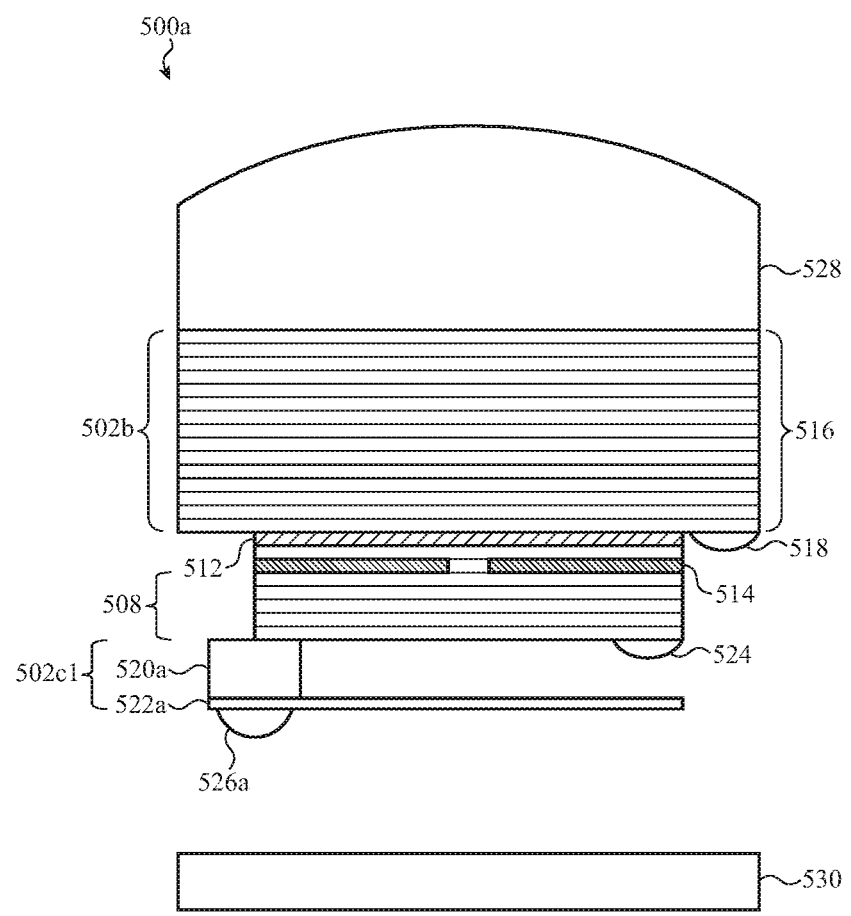
FIG. 5A illustrates an example inverted self-mixing sensor formed from a MEMS stacked with a VCSEL, as discussed herein.
Figure 5B:
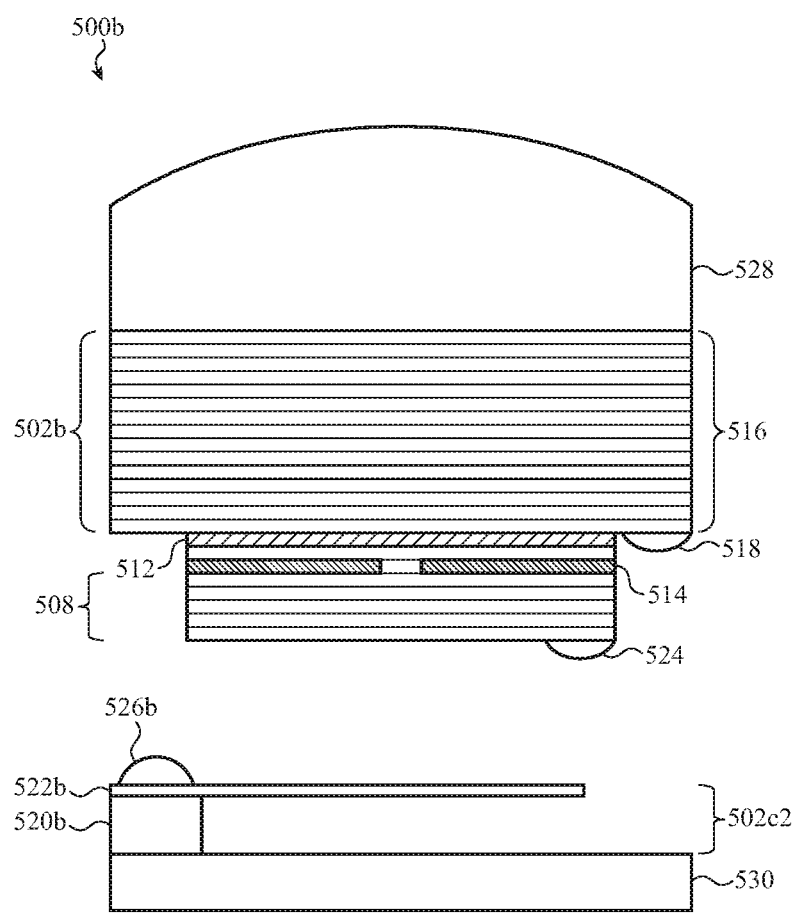
FIG. 5B illustrates an example inverted self-mixing sensor including a MEMS stacked with a photodetector, as discussed herein.
Figure 5C:
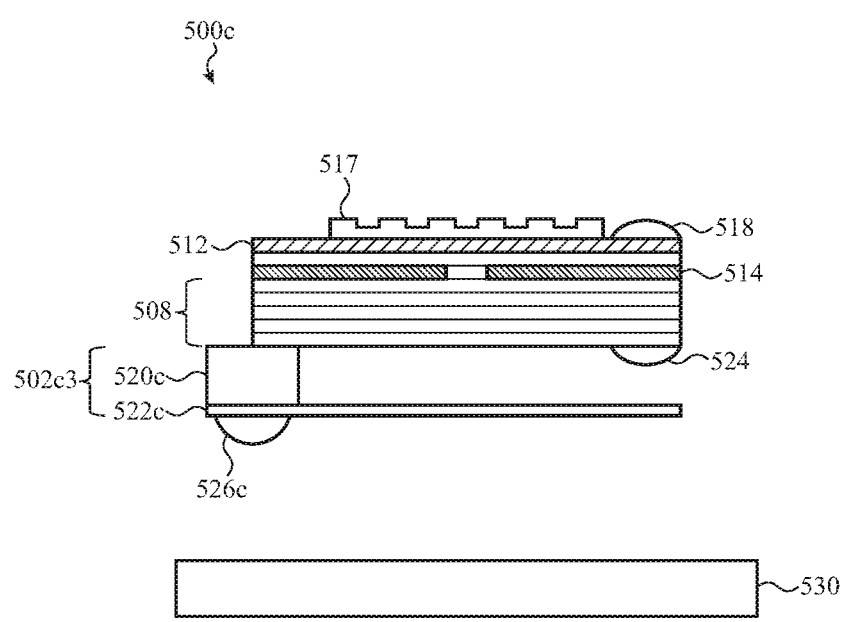
FIG. 5C illustrates an example inverted self-mixing sensor including a surface grating, as discussed herein.

FIGS. 5A-5C depict an example flip-chip self-mixing sensor 500a-500c. The self-mixing sensor 500a-500c may share similar features with the self-mixing sensor 300 of FIG. 3 and duplicative description may be omitted.

As discussed with respect to FIG. 3, a MEMS 302c may be positioned on a top surface of a top epitaxial stack 302b. As depicted in FIG. 5A, with respect to the self-mixing sensor 500a, a MEMS 502c1 may be positioned on a bottom surface of an epitaxial stack 502b. The epitaxial stack 502b may be, or otherwise include, a VCSEL. As the MEMS 502c1 is positioned in a cavity formed between the epitaxial stack 502b and photodetector 530, foreign substances may be less likely to come into contact with a surface of the MEMS 502c1.

A semiconductor substrate 528, such as i-GaAs, may form the top portion of the self-mixing sensor 500a. The semiconductor substrate 528 may include an optional on-chip lens formed on a top surface thereof. The semiconductor substrate 528 may shape laser light generated by the epitaxial stack 502b and may act as a reflector on one end of a laser cavity. The semiconductor substrate 528 may be curved to focus light to a certain point, or mode, and may shape a beam of light. The semiconductor substrate 528 may be omitted in some embodiments.

The epitaxial stack 502b may additionally include a p-type DBR (pDBR) 516 and an n-type DBR (nDBR) 508 which may have alternating materials with different refractive indices. One or more of the materials in the nDBR 508 are doped to be n-type and so form a part of the anode section of a p-n diode structure and one or more of the materials in the pDBR 516 are doped to be p-type and so form a part of the cathode section of a p-n diode structure. An exemplary pair of materials that may be used to form the nDBR 508 and/or the pDBR 516 are aluminum arsenide (AlAs) and gallium arsenide (GaAs). Though the nDBR 508 is described as an n-type DBR and the pDBR 516 is described as a p-type DBR, the nDBR 508 and the pDBR 516 may be doped to be any type. In some cases, the nDBR 508 and the pDBR 516 layers are formed from reflectors other than distributed Bragg reflectors.

The epitaxial stack 502b may additionally include a VCSEL active region layer 512 that functions, in part, as a lasing cavity. The VCSEL active region layer 512 may, in some embodiments, have a thickness between 15 nm and 60 nm, though the thickness is not limited to any particular value or range. In some cases, the VCSEL active region layer 512 may be formed from one or more quantum wells. An oxide layer 514 may be adjacent to the VCSEL active region layer 512 and may have an aperture through which laser light is emitted. A number of electrical contacts 518, 526a may be provided on one of the MEMS 502c1 or the epitaxial stack 502b to provide a voltage or a current to any of the described components, as discussed with respect to FIGS. 3 and 4.

The MEMS 502c1 may include a partially reflective layer 522a, which may be moveable with respect to the lasing cavity of the epitaxial stack 502b. As discussed with reference to FIG. 3, the partially reflective layer 522a may move to change a length of the lasing cavity, thereby tuning, or changing a wavelength of, emitted laser light. The MEMS 502c1 may additionally include a sacrificial layer 520a used to elevate the MEMS 502c1 above/below a surface of the epitaxial stack 502b. As discussed with respect to FIG. 3, the MEMS 502c1 may be formed from semiconductor layers (e.g., intrinsic GaAs/InP materials) and/or from dielectric materials (e.g., external Si/SiN/SiO$_2$ materials).

A photodetector 530 may be provided below the MEMS 502c1, such that an object positioned between the photodetector 530 and the MEMS 502c1 may be analyzed through self-mixing operations (e.g., through self-mixing signals received at the photodetector 530). The photodetector 530 may be a silicon-based photodetector.

FIG. 5B illustrates an example self-mixing sensor 500b. Identically numbered components illustrated in FIG. 5B may be similar to those discussed with respect to FIG. 5A and duplicative description is omitted for clarity.

The self-mixing sensor 500b may have a MEMS 502c2 positioned on a top surface of a photodetector 530. The MEMS 502c2 may include a sacrificial layer 520b, a partially reflective layer 522b, and an electrical contact 526b configured to receive a signal that varies a property of the partially reflective layer 522b. The MEMS 502c2 may be formed on the photodetector 503 and the partially reflective layer 522b may be configured (e.g., via an electrical signal received through the electrical contact 526b) to move with respect to the photodetector 530.

FIG. 5C illustrates an example self-mixing sensor 500c. Identically numbered components illustrated in FIG. 5C may be similar to those discussed with respect to FIGS. 5A-5B and duplicative description is omitted for clarity.

The self-mixing sensor 500c may have a MEMS 502c3 positioned on a top surface of a nDBR 508. As illustrated in FIG. 5C, the semiconductor substrate 528 and the pDBR 516 may be replaced by a surface grating 517. In some implementations, the grating 517 may be a meta-structure. The MEMS 502c3 may include a sacrificial layer 520c, a partially reflective layer 522c, and an electrical contact 526c configured to receive a signal that varies a property of the partially reflective layer 522c.

Figure 6:
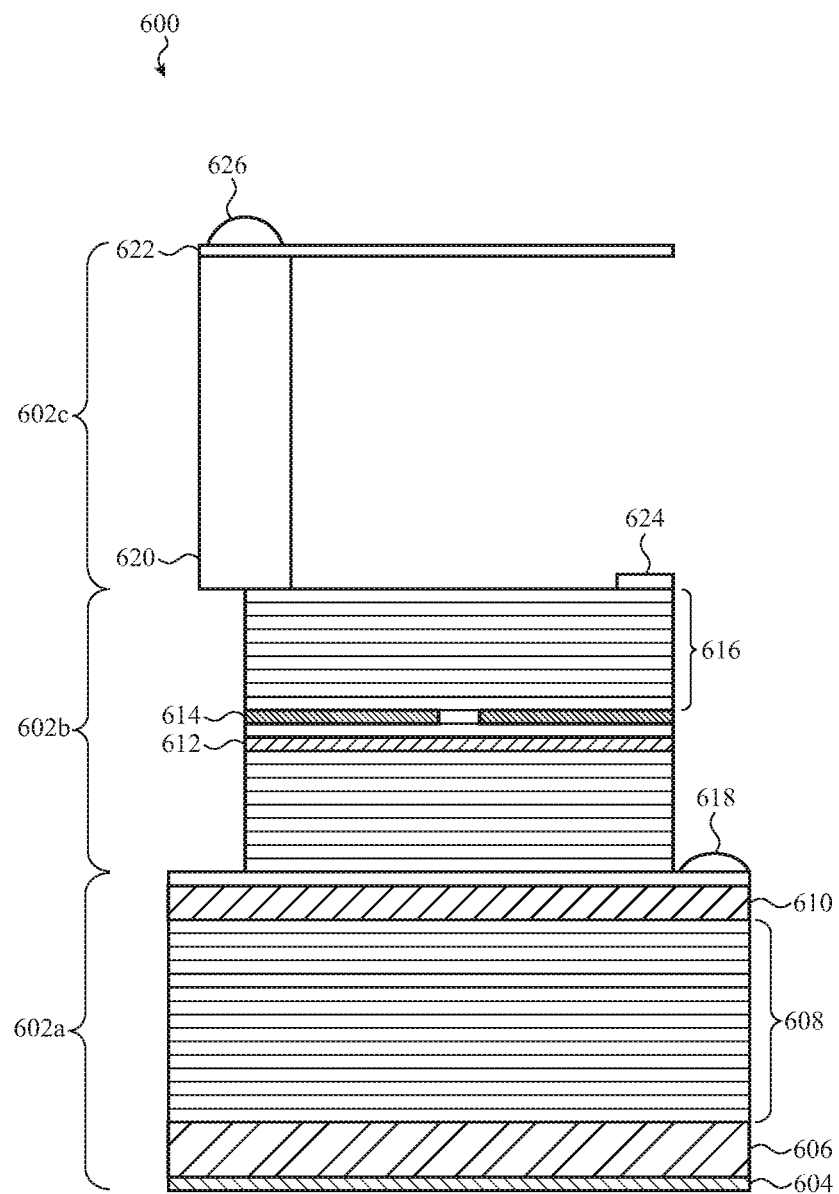
FIG. 6 illustrates an example high-powered self-mixing sensor formed with an expanded-cavity ViP, as discussed herein.

FIG. 6 illustrates an example of a high-powered self-mixing sensor 600 having an expanded-cavity. The high-powered self-mixing sensor 600 may be formed from a top epitaxial stack 602b, which may include or comprise a VCSEL, vertically adjacent to a bottom epitaxial stack 602a, which may include or comprise a photodetector, which may be referenced as a VCSEL-integrated photodetector (ViP). The bottom epitaxial stack 602a may be a resonant cavity photodetector (RCPD). In addition, a MEMS 602c may be vertically adjacent to the top epitaxial stack 602b.

Figure 10:
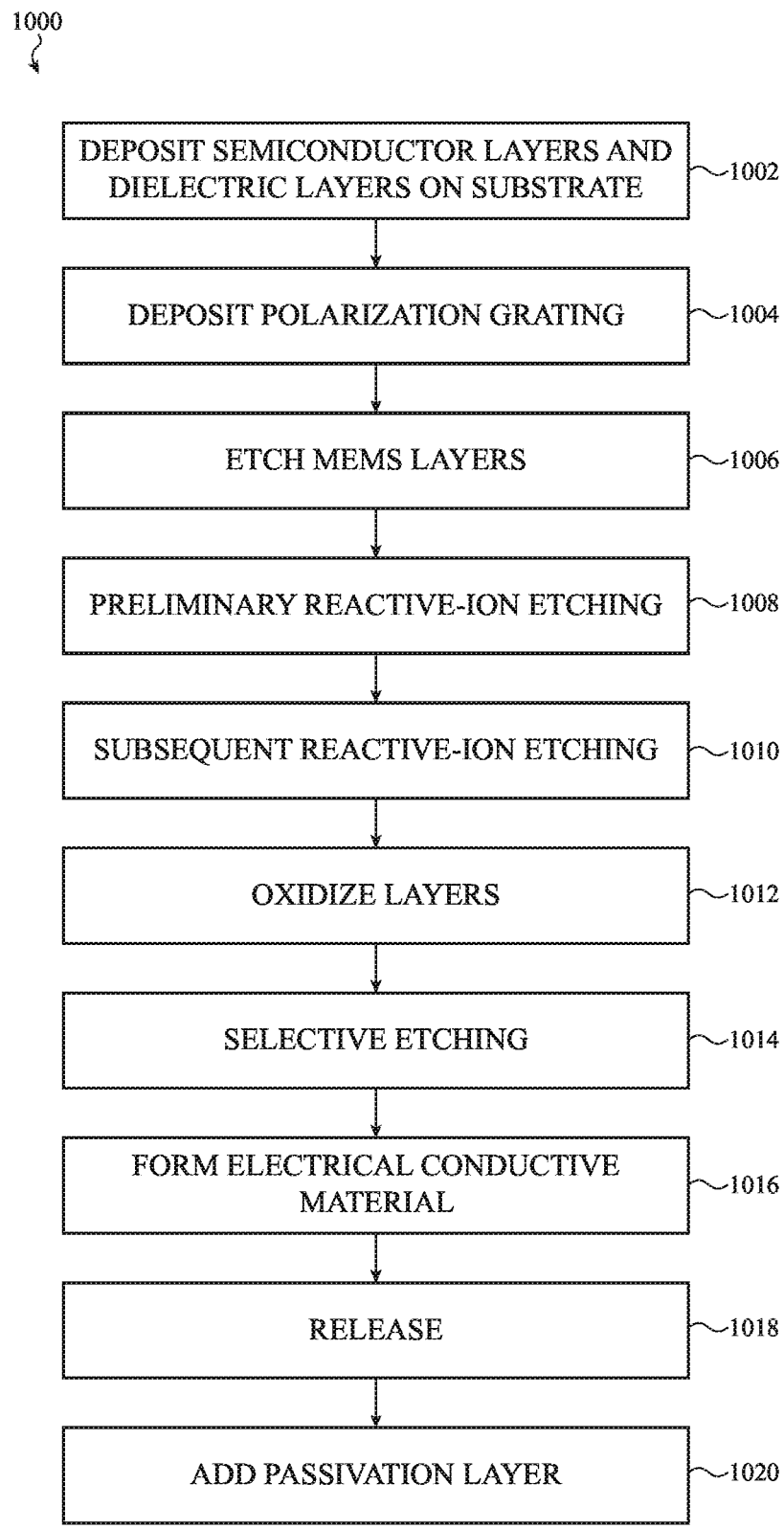
FIG. 10 depicts an example method for manufacturing a self-mixing sensor, as discussed herein.

The self-mixing sensor 600 may be manufactured and epitaxially grown by the process described with respect FIG. 10 or may be manufactured in accordance with any suitable process. When compared with the self-mixing sensor 300 of FIG. 3, a sacrificial layer 620 may be longer than a sacrificial layer 320 in order to extend a distance between a partially reflective layer 622 of a MEMS 602c and a top surface of a top epitaxial stack 602b. The sacrificial layer 620 may double a length of a laser cavity, though the length may be increased by any multiplier not limited to two. The longer length of the laser cavity may result in a higher-powered laser beam, a narrower free spectral range, and a narrower tunability range (e.g., wavelength tunability).

The semiconductor layers for the bottom epitaxial stack 602a may be epitaxially formed on a substrate 606, such as an n-type substrate. An electrical supply layer 604 may be formed in or on the substrate, such as on a side of the substrate 606 opposite to the bottom epitaxial stack 602a, and may be supplied with a reverse biased voltage. In some embodiments, the electrical supply layer 604 is a ground layer.

The bottom epitaxial stack 602a may additionally be structured with n-type DBR (nDBR) 608. The nDBR 608 may include a set of Bragg pairs of alternating materials having different refractive indices. One or more of the materials in the nDBR 608 are doped to be n-type and so form a part of the anode section of a p-n diode structure. An exemplary pair of materials that may be used to form the nDBR 608 are aluminum arsenide (AlAs) and gallium arsenide (GaAs). Though the nDBR 608 is described as an n-type DBR, the nDBR 608 may be doped to be any type. In some cases, the nDBR 608 layers are formed from reflectors other than distributed Bragg reflectors.

A photodetector active region layer 610 may be formed on top of the nDBR 608. The photodetector active region layer 610 may be a photon absorption layer, such as an indium gallium arsenide (InGaAs) layer. The photodetector active region layer 610 may, in some embodiments, have a thickness between 15 nm and 1000 nm, though the thickness is not limited to any particular value or range. In some cases, the photodetector active region layer 610 is formed from one or more quantum wells.

The top epitaxial stack 602b may be epitaxially grown on top of the bottom epitaxial stack 602a. The top epitaxial stack 602b may include a VCSEL active region layer 612 that functions, in part, as a lasing cavity. The VCSEL active region layer 612 may, in some embodiments, have a thickness between 15 nm and 1000 nm, though the thickness is not limited to any particular value or range. In some cases, the VCSEL active region layer 612 may be formed from one or more quantum wells. An oxide layer 614 may be adjacent to the VCSEL active region layer 612 and may have an aperture through which laser light is emitted.

The top epitaxial stack 602b may additionally be structured with p-type DBR (pDBR) 616. As discussed in relation to the nDBR 608, the pDBR 616 may include a set of Bragg pairs of alternating materials having different refractive indexes. Such materials may include AlAs and GaAs. The pDBR 616 may be formed from one or more materials that are doped to be p-type and so form a part of the cathode section of a p-n diode structure. The pDBR 616 layers may be optional and may be omitted in certain embodiments. An electrical contact 624 may be affixed to a topmost layer of the top epitaxial stack 602b and may be connected to a bias current, which may induce the emission of laser light from the top epitaxial stack 602b. In some cases, the top epitaxial stack 602b may operate with a single transverse mode on either an oxide aperture or high-contrast gratings.

A MEMS structure 602c may be formed on a top surface of the top epitaxial stack 602b. The MEMS structure 602c may be formed from a sacrificial layer 620 and a partially reflective layer 622. The sacrificial layer 620 may be used to extend a lasing cavity of the top epitaxial stack 602b significantly and may result in a high-powered laser output. In some cases, the sacrificial layer 620 has a length equal to or greater than a length of the pDBR 616 of the top epitaxial stack 602b. The sacrificial layer 620 may be formed of the same material as the pDBR 616 layers, though the sacrificial layer 620 may not be used to receive or transmit light. The partially reflective layer 622 may be formed as a vertical stack including one or more distributed Bragg reflectors and/or one or more gratings such as diffraction gratings. In some cases, the partially reflective layer 622 is a dielectric stack providing partial cavity reflectance and output coupling. Materials for a potential dielectric stack include titanium dioxide ($TiO_2$) and silicon dioxide ($SiO_2$).

The partially reflective layer 622 of the MEMS structure 602c may be formed from sub-wavelength lateral structures, such as surface relief grating, high-contrast grating, two-dimensional/multi-step binary diffractive phase masks, meta-surfaces, and so on. The sub-wavelength lateral structures may provide strong cavity reflectivity, such as reflectivity at or about 99%. In cases where sub-wavelength lateral structures are provided on the partially reflective layer 622, DBR layers of the top epitaxial stack 602b and/or the bottom epitaxial stack 602a may be reduced or eliminated. Sub-wavelength lateral structures may also assist in defining laser polarization, shaping and steering laser light outputs, and so on.

The MEMS structure 602c may be formed from the same materials as the top epitaxial stack 602b (e.g., GaAs) or may be formed of additional materials such as silicon, silicon nitride, and silicon dioxide. In cases where the MEMS structure 602c is formed from materials intrinsic to the top epitaxial stack 602b, the MEMS structure 602c may be formed from etching layers of an epitaxially grown semiconductor stack-up. In cases where the MEMS structure 602c is formed from extrinsic materials, the MEMS structure 602c may be formed independently of the ViP and may be deposited on a top surface of the top epitaxial stack 602b after the top epitaxial stack 602b and/or bottom epitaxial stack 602a is formed.

As depicted in FIG. 6, the semiconductor layers for the bottom epitaxial stack 602a extend beyond the semiconductor layers forming the top epitaxial stack 602b. Such a configuration may be formed by epitaxially forming all the layers included in the self-mixing sensor initially, and then etching part of the layers of the top epitaxial stack 602b. An electrical supply contact 618 may be affixed to topmost layer of the bottom epitaxial stack 602a at such a position that extends laterally beyond the top epitaxial stack 602b. The electrical supply contact 618 may be connected to a common ground and may act as a cathode of the top epitaxial stack 602b and/or an anode of the bottom epitaxial stack 602a. In additional or alternative embodiments, the semiconductor layers for the bottom epitaxial stack 602a do not extend beyond the semiconductor layers of the top epitaxial stack 602b on one or multiple sides of the self-mixing sensor 600. In some embodiments, during formation of a particular layer of the common set of semiconductor layers, techniques such as masking and doping are used to alter a doping or chemical composition of a certain layer.

In operation, the top epitaxial stack 602b is electrically pumped. A forward voltage bias is applied to the electrical supply contact 624, which induces a bias current $I_{BIAS}$ to flow into the top epitaxial stack 602b and induce emission of laser light. For at least part of the time that the top epitaxial stack 602b is emitting laser light, the bottom epitaxial stack 602a may be reverse biased by the application of a voltage at the electrical supply layer 604, to cause the flow of a photocurrent $I_{PD}$. In addition to the emitted laser light, some of laser light produced in the VCSEL active region layer 612 may be directed downward and be absorbed or received in the reverse biased bottom epitaxial stack 602a and, specifically, by the photodetector active region layer 610.

If some of the emitted laser light is reflected from an object (not shown) and is received in the top epitaxial stack 602b, self-mixing interference may occur that induces an alteration in the wavelength of the emitted laser light. Some of such altered laser light may then be received in the bottom epitaxial stack 602a, producing a measurable change in the photocurrent $I_{PD}$, or another electrical or interferometric property of the bottom epitaxial stack 602a. Such a measurable change may be used to infer a distance or a motion of the reflecting object.

The MEMS structure 602c may additionally be electrostatically actuated by applying a voltage bias to an electrical supply contact 626. The voltage bias applied to the electrical supply contact 626 may be independent from the forward voltage bias applied to the electrical supply contact 624 associated with the top epitaxial stack 602b. The voltage bias applied to the electrical supply contact 626 of the MEMS structure 602c may be varied to change a property of the partially reflective layer 622. By increasing or decreasing the applied reverse voltage bias, a distance between the partially reflective layer 622 and a top surface of the top epitaxial stack 602b may increase or decrease, a curvature of the partially reflective layer 622 may change, and so on. In this way, a lasing cavity is changed. In accordance with optical principles, changing a lasing cavity may change properties (e.g., wavelengths or modes) of an emitted laser light. By variations of the partially reflective layer 622, control of lasing properties of top epitaxial stack 602b can be achieved. Due to the extended cavity arising from a long sacrificial layer 620, the self-mixing sensor 600 may have a narrow free spectral range and/or a narrow tunability, with respect to the self-mixing sensor 300 depicted and described with respect to FIG. 3.

The MEMS structure 602c may allow tuning at a wavelength-scale accuracy. That is, the partially reflective layer 622 may be controlled to produce a laser light with a particular wavelength. Further, power supplied to the top epitaxial stack 602b and a temperature of the self-mixing sensor 600 may remain relatively consistent while tuning through the use of the MEMS structure 602c. In this way, tuning may be performed linearly. A tuning range of the self-mixing sensor 600 may be about 1%-5% of an initial laser wavelength produced by the top epitaxial stack 602b, though, in some embodiments, a tuning range may be less than 1% and/or over 5%. Further, the MEMS structure 602c may be tuned at a megahertz modulation speed, though, in some embodiments, a modulation speed may be faster or slower. As a result of the modulation speed, a low duty cycle may be associated with the self-mixing sensor 600.

Figure 7A:
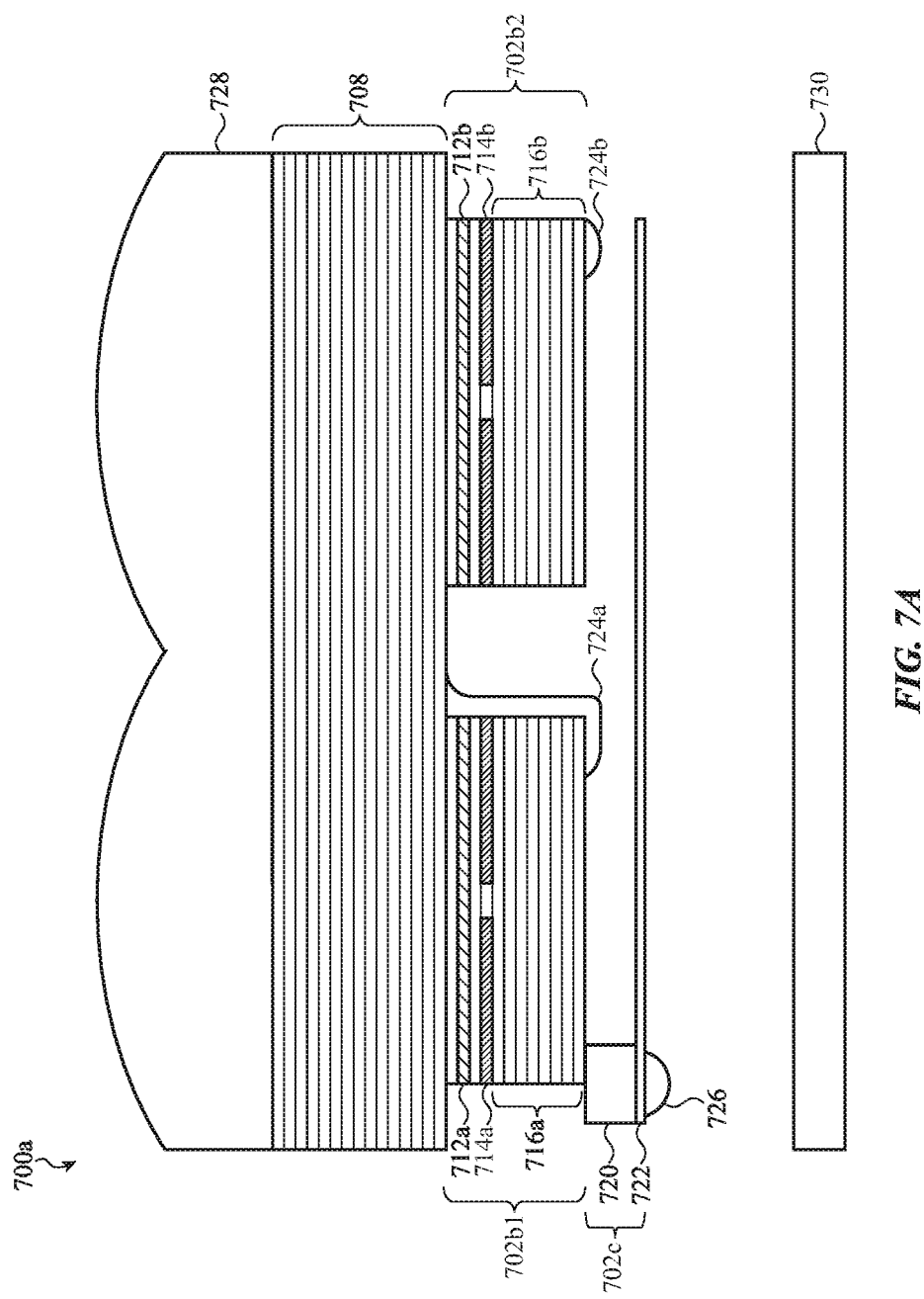
FIG. 7A illustrates an example self-mixing sensor array, as discussed herein.

FIG. 7A illustrates an example self-mixing sensor array 700a. Multiple self-mixing sensors, including the self-mixing sensors described herein, may be coupled together to create an array of sensors, so as to create a number of coherent pixels. In the embodiment depicted in FIG. 7A, a single, shared MEMS structure 702c may be positioned above a first VCSEL portion 702b1 and a second VCSEL portion 702b2. Both the first VCSEL portion 702b1 and the second VCSEL portion 702b2 may be coupled to a shared nDBR 708, which may extend beneath both the first VCSEL portion 702b1 and the second VCSEL portion 702b2. A shared semiconductor substrate 728 may optionally be provided to a surface of the shared nDBR 708 and may reflect internal laser light within a lasing cavity and/or focus emitted laser light, as discussed above.

The first VCSEL portion 702b1 may be similar to the second VCSEL portion 702b2. The first VCSEL portion 702b1 may be formed from a first VCSEL active region layer 712a, a first oxide layer 714a, and a first pDBR 716a. The functionality of these elements are discussed with respect to other figures, such as FIGS. 5A-5C, above. Likewise, the second VCSEL portion 702b2 may be formed from a second VCSEL active region layer 712b, a second oxide layer 714b, and a second pDBR 716b. In some embodiments, the aforementioned layers are common layers epitaxially deposited on the shared nDBR 708 and the layers are etched to form a trench between the first VCSEL portion 702b1 and the second VCSEL portion 702b2.

A first electrical contact 724a may be provided on the first VCSEL portion 702b1 and a second electrical contact 724b may be provided on the second VCSEL portion 702b2, so to independently drive the respective VCSEL structures. In some cases, a common electrical contact is provided such that the VCSEL structures are driven identically.

The MEMS structure 702c may be formed from a sacrificial layer 720 and a partially reflective layer 722. The structure and purpose of the sacrificial layer 720 and the partially reflective layer 722 may be similar to those discussed herein and are not repeated here. In the embodiment depicted in FIG. 7A, the partially reflective layer 722 may extend over both the first VCSEL portion 702b1 and the second VCSEL portion 702b2. Therefore, a tuning process (e.g., changing a lasing cavity length) may be performed across both VCSEL structures. The MEMS structure 702c may additionally be provided with an electrical contact 726 to provide a driving voltage to the MEMS structure 702c, as discussed above. A silicon photodetector, though not depicted in FIG. 7A, may additionally be placed below the MEMS structure 702c to detect self-mixing signals and to transmit the self-mixing signals to processing circuitry.

A photodetector 730 may be provided below the MEMS 702c, such that an object positioned between the photodetector 730 and the MEMS 702c may be analyzed through self-mixing operations (e.g., through self-mixing signals received at the photodetector 730). The photodetector 730 may be a silicon-based photodetector and may be positioned on a substrate.

The photodetector 730 may comprise a single photodetector pixels or may comprise an array of photodetectors (e.g., an array of an 'N' number of photodetectors). A ratio between a number of light emitters (e.g., a VCSEL) and a number of light receivers (e.g., a photodetector) may be set to any value. For example, the number of light emitters may be equivalent to the number of light receivers (e.g., a ratio of 1:1). In some embodiments, the number of light emitters may be twice the number of light receivers (e.g., a ratio of 2:1). Other ratios may be used in accordance with the provided disclosure. The light emitters and the light receivers may be individually addressable or may be collectively addressable in any segmentation thereof.

In the embodiment depicted in FIG. 7A, a single MEMS structure 702c is shared across both of the VCSEL pixels. In alternative embodiments, each VCSEL pixel may be associated with an individually tunable MEMS structure.

FIG. 7B illustrates an example self-mixing sensor array 700b. Identically numbered components illustrated in FIG. 7B may be similar to those discussed with respect to FIG. 7A and duplicative description is omitted for clarity.

In the self-mixing sensor array 700b, the semiconductor substrate 728 and the nDBR 708 may be replaced by a surface grating 717. In some implementations, the grating 717 may be a meta-structure.

Figure 8:
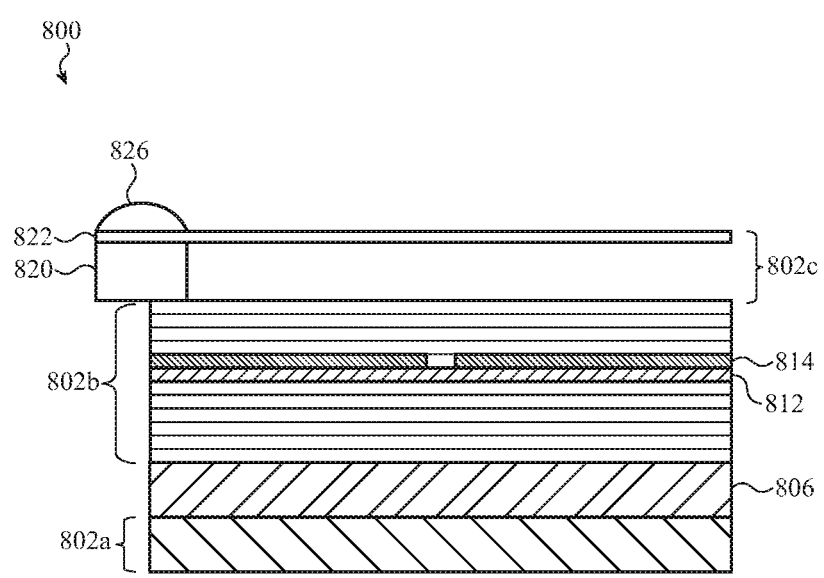
FIG. 8 illustrates an example self-mixing sensor where a photodetector is positioned below a VCSEL, as discussed herein.

FIG. 8 illustrates an example self-mixing sensor 800 including a backside photodetector 802a. As depicted in FIG. 8, a substrate 806 may be provided. A VCSEL 802b may be positioned on one side of the substrate 806 and a photodetector 802a may be positioned on the opposite side of the substrate 806. The photodetector 802a may include any number of components as discussed herein, such as a photodetector active layer 810 and n-type/p-type semiconductor layers surrounding the photodetector active layer 810.

In operation, the VCSEL 802b may emit laser light through a top surface and a bottom surface of the VCSEL 802b. The light emitted through the top surface may impact an object and may reflect back into the VCSEL 802b where a self-mixing operation occurs, as discussed herein. The light emitted through the bottom surface may be received by the photodetector 802a and properties of the light may be detected.

The VCSEL 802b may operate as other VCSELs described above. The VCSEL 802b may include a VCSEL active layer 812, an oxide layer 814, and n-type/p-type DBR layers surrounding the VCSEL active layer 812 and the oxide layer 814.

The MEMS structure 802c may be positioned on a top surface of the VCSEL 802b. The MEMS structure 802c may include a sacrificial layer 820 and a partially reflective layer 822. The MEMS structure 802c may operate as other MEMS structures described herein and duplicative description is omitted with respect to FIG. 8.

Figure 9:
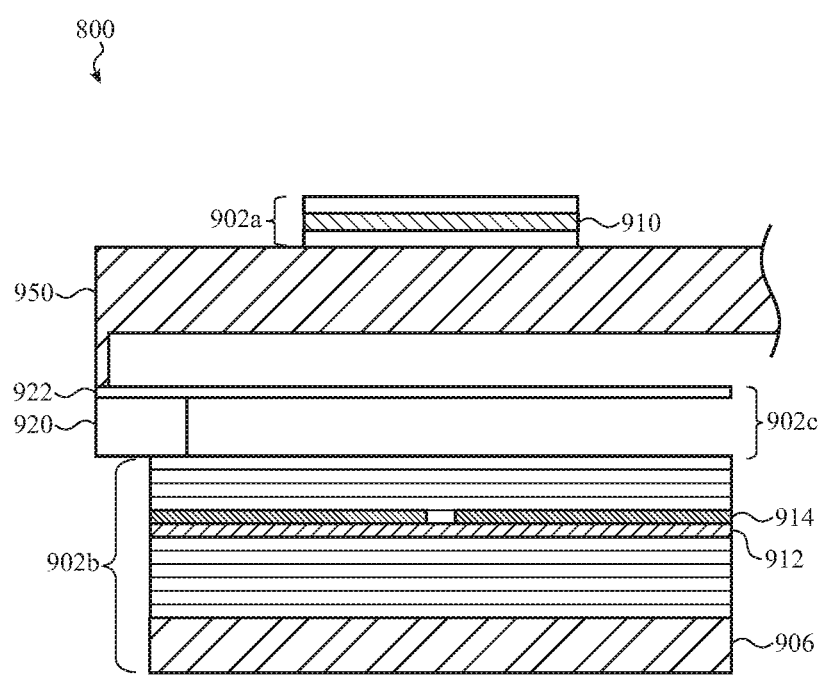
FIG. 9 illustrates an example self-mixing sensor where a photodetector is positioned on a top portion of the self-mixing sensor, as discussed herein.

FIG. 9 illustrates an example self-mixing sensor 900 including a top photodetector 902a. As depicted in FIG. 9, a substrate 906 may be provided. A VCSEL 902b may be positioned on one side of the substrate 906, The VCSEL 902b may operate as other VCSELs described above. The VCSEL 902b may include a VCSEL active layer 912, an oxide layer 914, and n-type/p-type DBR layers surrounding the VCSEL active layer 912 and the oxide layer 914.

The MEMS structure 902c may be positioned on a top surface of the VCSEL 902b (e.g., between a VCSEL 902b and a substrate cap 950). The MEMS structure 902c may include a sacrificial layer 920 and a partially reflective layer 922. The MEMS structure 902c may operate as other MEMS structures described herein and duplicative description is omitted with respect to FIG. 9.

A substrate cap 950 may additionally be provided on a top surface of the MEMS structure 902c. The substrate cap 950 may be supported on multiple sides and may extend to other self-mixing sensors surrounding the self-mixing sensor 900. The substrate cap 950 may be at least partially transparent to light emitted by the VCSEL 902b so that emitted light may pass through the substrate cap 950 and to the photodetector 902a and/or detected object. In some cases, the substrate cap 950 is formed from GaAs.

A photodetector 902a may be provided on a top surface of the substrate cap 950. The photodetector 902a may include any number of components as discussed herein, such as a photodetector active layer 910 and n-type/p-type semiconductor layers surrounding the photodetector active layer 910. Laser light emitted by the VCSEL 902b may pass through the MEMS structure 902c and the substrate cap 950 and may be received by the photodetector 902a, where a measurement of properties of the emitted light is performed. Other self-mixing operations may additionally occur, as discussed above.

FIG. 10 is a flowchart depicting an example manufacturing process 1000 of a ViP including a MEMS structure, according to any of the previously described examples. FIG. 10 is only one example of a potential manufacturing process, and any number of processes could be used to create the products discussed herein.

At operation 1002, a manufacturing process 1000 begins by epitaxially depositing semiconductor and dielectric layers on a substrate. As discussed above, the substrate may be an n-type substrate and may be formed from Gallium Arsenide (GaAs). Deposited layers may include DBR layers (both n-type and p-type, as discussed above), active laser/photoconductor layers, sacrificial layers for a MEMS, and MEMS layers. The MEMS layers may be formed from a high-contrast reflector dielectric, may be formed from p-type semiconductor layers, and so on.

At operation 1004, the manufacturing process 1000 may continue by forming one or more polarization setting gratings on a previously formed layer. For example, a polarization setting grating may be formed on a top surface of a partially reflective layer of a MEMS structure to polarize a light output from an associated VCSEL, as discussed above.

At operation 1006, an etching step may be performed. A partially reflective layer for a MEMS structure may be patterned and/or etched to prepare the remaining, previously epitaxially deposited, layers for future etching or depositing processes. As discussed, the MEMS may be formed from either dielectric layers, semiconductor layers, or any combination thereof and operation 1006 may reference the etching of these layers.

At operation 1008, a preliminary reactive-ion etching (RIE) process may be performed. The RIE process is a type of dry etching that uses chemically reactive plasma to remove previously deposited material. At operation 1008, the preliminary RIE may remove certain dielectric and/or semiconductor layers to prepare the semiconductor structure for a subsequent oxidation process.

At operation 1010, a secondary RIE process may be performed. The secondary RIE process may remove additional material from the semiconductor structure. The secondary RIE process may be performed on different layers, compared with the preliminary RIE process at operation 1008, and may prepare the semiconductor structure for alignment. The operation at 1008 and 1010 may be performed separately to avoid large amounts of material from being removed at the same time, which may be difficult to efficiently remove effectively. In some cases, the operations at 1008 and 1010 are performed at the same time.

At operation 1012, certain layers of a semiconductor structure may be oxidized. For example, the RIE processes at 1008 and/or 1010 may uncover portions of certain layers of a semiconductor structure. As some layers are uncovered, an oxidization process may occur with respect to the at least partially uncovered layers. As an example, an oxide layer, as discussed above with respect to, for example, oxide layers 314/514, may be oxidized at this operation.

At operation 1014, a selective etching (SE) process may be performed. The SE process may selectively etch ends of certain layers, such as an active layer, to prepare the semiconductor structure for the deposition of electrodes and/or for subsequent etching processes. The selective etching process may include a number of discrete etching processes including RIE etching processes, to prepare the semiconductor structure for material deposition steps.

At operation 1016, electrical conductive material may be deposited at predetermined locations on the semiconductor structure. The electrical conductive material may form electrical contacts, as discussed with respect to, for example, FIGS. 3-5. The electrical conductive material may be deposited through any relevant process, including directional evaporation, and may comprise any electrically conductive, or partially electrically conductive, material such as gold.

At operation 1018, a release step may be performed. The release may be a dry etch release, using a gas such as sulfur hexafluoride. In cases, polymers that form during the release step may be removed by wet cleaning processes. Citric acid may be used in alternative or additional embodiments during the release step.

At operation 1020, a surface passivation process may be performed. For example, atomic layer deposition (ALD) may be used to coat passivation layers on a surface of a MEMS (e.g., a MEMS grating) and/or VCSEL emitting surface layers. In some implementations, the operation 1020 may be omitted.

The MEMS/ViP structures, as discussed herein, may be used for any number of applications where a self-mixing sensor can be utilized. For example, the MEMS/ViP structures may be provided in an electronic device such as a mobile phone, a smart phone, an electronic watch, a computer, a tablet computer, earbuds or headphones, eyeglasses, and so on. For example, the MEMS/ViP structures may be used as an input device and may detect a user's swipe or gesture. In other examples, the MEMS/ViP structures may detect biological signals from a user, such a heartbeat, blood flow, muscle activity, and so on.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of defining relative positions of various structures, and may not always define absolute positions. For example, a first structure described as being "above" a second structure and "below" a third structure is also "between" the second and third structures, and would be "above" the third structure and "below" the second structure if the stack of structures were to be flipped. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes one or more of any of the items, or one or more of any combination of the items, or one or more of each of the items. By way of example, the phrases "at least one of A, B, and C" or "at least one of A, B, or C" each refer to one or more of only A, only B, or only C; any combination of A, B, or C; and one or more of each of A, B, and C. Similarly, it may be appreciated that an order of elements presented for a conjunctive or disjunctive list provided herein should not be construed as limiting the disclosure to only that order provided.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A self-mixing interferometry (SMI) sensor comprising:
a photodetector comprising a first set of semiconductor layers formed on a substrate;
a vertical cavity surface emitting laser (VCSEL) stacked with the photodetector and comprising a second set of semiconductor layers formed on the first set of semiconductor layers; and
a microelectromechanical system (MEMS) stacked with the VCSEL on a side opposite from the photodetector and comprising an at least partially reflective layer, wherein:
the VCSEL is configured to emit light; and
the MEMS is configured to change a length of a resonant cavity associated with the VCSEL, thereby changing a property of the emitted light.

2. The SMI sensor of claim 1, wherein the VCSEL is further configured to:
receive reflections of the emitted light after the emitted light interacts with an object; and
undergo self-mixing interference after receiving the reflections of the emitted light.

3. The SMI sensor of claim 2, further comprising a processor, wherein:

at least a portion of the emitted light is received by the photodetector; and based on at least the portion of the emitted light received by the photodetector, the processor determines at least one of a speed of the object, a roughness of the object, or a distance between the SMI sensor and the object.

4. The SMI sensor of claim 1, wherein the MEMS is separated from the VCSEL by a void in a semiconductor layer.

5. The SMI sensor of claim 1, further comprising processing circuitry configured to:

supply a first current to the VCSEL, the first current configured to drive the VCSEL; and supply a second current to the MEMS, the second current separate from the first current and configured to cause a movement of the MEMS.

6. The SMI sensor of claim 1, wherein the changed property of the emitted light is a wavelength of the emitted light.

7. The SMI sensor of claim 6, wherein the at least partially reflective layer of the MEMS is formed from at least one of:

a third set of semiconductor layers; or a set of dielectric layers.

8. A tunable sensor for performing self-mixing interferometry, the tunable sensor comprising:

a vertical cavity surface emitting laser (VCSEL) comprising a laser cavity;

a microelectromechanical system (MEMS) comprising an at least partially reflective layer defining an end of the laser cavity; and a photodetector positioned to receive light emitted by the VCSEL after the light passes through the at least partially reflective layer, wherein a position of the at least partially reflective layer, which is moved when a voltage is applied to the MEMS, defines a length of the laser cavity.

9. The tunable sensor of claim 8, wherein:

the VCSEL is a first VCSEL provided on a first set of semiconductor layers;

a second VCSEL is provided on the first set of semiconductor layers, the second VCSEL having a second laser cavity and the first VCSEL and the second VCSEL being separated by a trench; and the at least partially reflective layer of the MEMS extends across the first VCSEL and the second VCSEL and further defines a second length of the second laser cavity.

10. The tunable sensor of claim 8, wherein the MEMS changes the length of the laser cavity by moving the at least partially reflective layer from a first position to a second position.

11. The tunable sensor of claim 8, wherein changing the length of the laser cavity results in changing a property of the light emitted by the VCSEL.

12. The tunable sensor of claim 11, wherein the changed property of the light emitted by the VCSEL is a wavelength of the light.

13. The tunable sensor of claim 8, further comprising a condenser lens disposed in a light emission path of the VCSEL on a first surface opposite from a second surface where the MEMS is coupled to the VCSEL.

14. The tunable sensor of claim 13, wherein the VCSEL comprises:

an active layer;

an oxide layer adjacent to the active layer;

a first set of distributed Bragg reflectors positioned between the MEMS and the oxide layer; and a second set of distributed Bragg reflectors positioned between the condenser lens and the active layer.

15. The tunable sensor of claim 8, wherein the photodetector is spaced apart from the MEMS and the VCSEL.

16. A self-mixing sensor comprising:

a substrate;

a first set of semiconductor layers positioned above the substrate, the first set of semiconductor layers operating as a first light receiving or light emitting element;

a second set of semiconductor layers stacked with the first set of semiconductor layers, the second set of semiconductor layers operating as a second light receiving or light emitting element; and a microelectromechanical system (MEMS) stacked with the second set of semiconductor layers, the MEMS comprising a moveable reflective layer.

17. The self-mixing sensor of claim 16, further comprising processing electronics electrically coupled with the first set of semiconductor layers, the processing electronics configured to analyze electrical current produced by the first set of semiconductor layers to determine self-mixing properties of the light.

18. The self-mixing sensor of claim 16, wherein the first set of semiconductor layers and the second set of semiconductor layers each comprise distributed Bragg reflectors.

19. The self-mixing sensor of claim 16, wherein the moveable reflective layer comprises at least one of a diffractive grating or a subwavelength grating to polarize the light produced by a VCSEL.

20. The self-mixing sensor of claim 16, further comprising a void positioned between the MEMS and the second set of semiconductor layers, the void and the second set of semiconductor layers at least partially defining a laser cavity.

* * * * *